US010522700B2

(12) United States Patent
Campanella

(10) Patent No.: US 10,522,700 B2
(45) Date of Patent: *Dec. 31, 2019

(54) FRAME-LESS ENCAPSULATED PHOTO-VOLTAIC (PV) SOLAR POWER PANEL SUPPORTING SOLAR CELL MODULES ENCAPSULATED WITHIN OPTICALLY-TRANSPARENT EPOXY-RESIN MATERIAL COATING A PHENOLIC RESIN SUPPORT SHEET

(71) Applicant: National Mechanical Group Corp, Manalapan, NJ (US)

(72) Inventor: Nicholas B. Campanella, Manalapan, NJ (US)

(73) Assignee: NATIONAL MECHANICAL GROUP CORP., Manalapan, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/979,515

(22) Filed: May 15, 2018

(65) Prior Publication Data
US 2019/0288139 A1 Sep. 19, 2019

Related U.S. Application Data

(63) Continuation of application No. 15/921,458, filed on Mar. 14, 2018.

(51) Int. Cl.
*H01L 31/048* (2014.01)
*H02S 40/34* (2014.01)
*H01L 31/02* (2006.01)

(52) U.S. Cl.
CPC ...... *H01L 31/0481* (2013.01); *H01L 31/0201* (2013.01); *H02S 40/34* (2014.12)

(58) Field of Classification Search
CPC .. H01L 31/0481; H01L 31/0201; H02S 40/34
See application file for complete search history.

(56) References Cited

U.S. PATENT DOCUMENTS 3,957,537 A 5/1976 Baskett
4,139,399 A 2/1979 Lindmayer
(Continued)

FOREIGN PATENT DOCUMENTS

WO 2014071341 5/2014

OTHER PUBLICATIONS

Sun Pacific Power Corporation, "Decorative Area Lighting", Jan. 2012, (pp. 1-4).
(Continued)

*Primary Examiner* — Jayne L Mershon
(74) *Attorney, Agent, or Firm* — Thomas J. Perkowski, Esq.

(57) ABSTRACT

A frame-less epoxy-resin encapsulated solar power panel, in which an optically-transparent epoxy-resin coating is applied over an array of photo-voltaic (PV) solar cell modules mounted on a support sheet of phenolic resin, and supported in a layer of adhesive coating applied as a liquid with a viscosity and a thickness such that the thickness of the layer of adhesive coating is substantially equal to the thickness of the PV solar cell modules, and cured to a sufficient hardness. The optically-transparent epoxy-resin coating, and the cured layer of adhesive coating, reinforce the strength of the sheet of phenolic resin, particularly around the perimeter of the frame-less epoxy-resin encapsulated solar power panel.

6 Claims, 25 Drawing Sheets

(56) References Cited

U.S. PATENT DOCUMENTS

| | | |
|---|---|---|
| 4,149,665 A | 4/1979 | Frosch |
| 4,210,462 A | 7/1980 | Tourneux |
| 4,224,081 A | 9/1980 | Kawamura |
| 4,239,555 A | 12/1980 | Scharlack |
| 4,249,958 A | 2/1981 | Baudin |
| 4,321,417 A | 3/1982 | Kurth |
| 4,336,413 A | 6/1982 | Tourneux |
| 4,364,508 A | 12/1982 | Lazzery |
| 4,371,739 A | 2/1983 | Lewis |
| 4,382,833 A | 5/1983 | Coyle |
| 4,401,839 A | 8/1983 | Pyle |
| 4,433,200 A | 2/1984 | Jester |
| 4,461,922 A | 7/1984 | Gay |
| 4,542,257 A | 9/1985 | Fraser |
| 4,571,446 A | 2/1986 | Yamazaki |
| 4,611,090 A | 9/1986 | Catella |
| 4,625,070 A | 11/1986 | Berman |
| 4,633,032 A | 12/1986 | Oido |
| 4,654,467 A | 3/1987 | Yamazaki |
| 4,659,867 A | 4/1987 | Yamazaki |
| 4,689,874 A | 9/1987 | Nishiura |
| 4,692,557 A | 9/1987 | Samuelson |
| 4,718,185 A | 1/1988 | Conlin |
| 4,724,010 A | 2/1988 | Okaniwa |
| 4,773,944 A | 9/1988 | Nath |
| 4,830,038 A | 5/1989 | Anderson |
| 4,847,669 A | 7/1989 | Yamazaki |
| RE33,208 E | 5/1990 | Yamazaki |
| 5,022,930 A | 6/1991 | Ackerman |
| 5,059,254 A | 10/1991 | Yaba |
| 5,092,939 A | 3/1992 | Nath |
| 5,110,370 A | 5/1992 | Vogeli |
| 5,112,408 A | 5/1992 | Melchior |
| 5,128,181 A | 7/1992 | Kunert |
| 5,228,925 A | 7/1993 | Nath |
| 5,228,926 A | 7/1993 | Glatfelter |
| 5,238,519 A | 8/1993 | Nath |
| 5,252,141 A | 10/1993 | Inoue |
| 5,268,038 A | 12/1993 | Riermeier |
| 5,273,911 A | 12/1993 | Sasaki |
| 5,280,133 A | 1/1994 | Nath |
| 5,289,999 A | 3/1994 | Naujeck |
| 5,290,366 A | 3/1994 | Riermeier |
| 5,338,369 A | 8/1994 | Rawlings |
| 5,344,501 A | 9/1994 | Hashimoto |
| 5,354,385 A | 10/1994 | Hashimoto |
| 5,409,549 A | 4/1995 | Mori |
| 5,441,577 A | 8/1995 | Sasaki |
| 5,474,620 A | 12/1995 | Nath |
| 5,476,553 A | 12/1995 | Hanoka |
| 5,478,402 A | 12/1995 | Hanoka |
| 5,480,494 A | 1/1996 | Inoue |
| 5,507,880 A | 4/1996 | Ishikawa |
| 5,512,107 A | 4/1996 | Van Den Berg |
| 5,580,509 A | 12/1996 | Van Den Berg |
| 5,584,940 A | 12/1996 | Yoshida |
| 5,597,422 A | 1/1997 | Kataoka |
| 5,647,915 A | 7/1997 | Zukerman |
| 5,651,837 A | 7/1997 | Ohtsuka |
| 5,660,646 A | 8/1997 | Kataoka |
| 5,697,192 A | 12/1997 | Inoue |
| 5,725,006 A | 3/1998 | Kawama |
| 5,733,382 A | 3/1998 | Hanoka |
| 5,741,370 A | 4/1998 | Hanoka |
| 5,761,158 A | 6/1998 | Azuma |
| 5,762,720 A | 6/1998 | Hanoka |
| 5,768,831 A | 6/1998 | Melchior |
| 5,782,994 A | 7/1998 | Mori |
| 5,800,631 A | 9/1998 | Yamada |
| 5,821,597 A | 10/1998 | Nakajima |
| 5,863,354 A | 1/1999 | Yoshida |
| 5,951,785 A | 9/1999 | Uchihashi |
| 5,973,258 A | 10/1999 | Shiotsuka |
| 5,986,203 A | 11/1999 | Hanoka |
| 5,990,413 A | 11/1999 | Ortabasi |
| 6,008,450 A | 12/1999 | Ohtsuka |
| 6,025,555 A | 2/2000 | Mori |
| 6,031,177 A | 2/2000 | Voss |
| 6,034,323 A | 3/2000 | Yamada |
| 6,072,115 A | 6/2000 | Inoue |
| 6,075,201 A | 6/2000 | Wambach |
| 6,075,202 A | 6/2000 | Mori |
| 6,111,189 A | 8/2000 | Garvison |
| 6,113,718 A | 9/2000 | Yamada |
| 6,114,046 A | 9/2000 | Hanoka |
| 6,128,868 A | 10/2000 | Ohtsuka |
| 6,155,006 A | 12/2000 | Mimura |
| 6,160,215 A | 12/2000 | Curtin |
| 6,172,295 B1 | 1/2001 | Hattori |
| 6,180,868 B1 | 1/2001 | Yoshino |
| 6,182,403 B1 | 2/2001 | Mimura |
| 6,187,448 B1 | 2/2001 | Hanoka |
| 6,201,181 B1 | 3/2001 | Azzam |
| 6,215,060 B1 | 4/2001 | Komori |
| 6,218,606 B1 | 4/2001 | Morizane |
| 6,245,987 B1 | 6/2001 | Shiomi |
| 6,269,596 B1 | 8/2001 | Ohtsuka |
| 6,271,053 B1 | 8/2001 | Kondo |
| 6,288,323 B1 | 9/2001 | Hayashi |
| 6,288,324 B1 | 9/2001 | Komori |
| 6,288,325 B1 | 9/2001 | Jansen |
| 6,291,761 B1 | 9/2001 | Takada |
| 6,294,722 B1 | 9/2001 | Kondo |
| 6,300,555 B1 | 10/2001 | Kondo |
| 6,300,556 B1 | 10/2001 | Yamagishi |
| 6,307,144 B1 | 10/2001 | Mimura |
| 6,323,416 B1 | 11/2001 | Komori |
| 6,329,588 B1 | 12/2001 | Zander |
| 6,331,671 B1 | 12/2001 | Makita |
| 6,336,304 B1 | 1/2002 | Mimura |
| 6,337,436 B1 | 1/2002 | Ganz |
| 6,353,042 B1 | 3/2002 | Hanoka |
| 6,369,315 B1 | 4/2002 | Mizukami |
| 6,380,478 B1 | 4/2002 | Yamamoto |
| 6,384,315 B1 | 5/2002 | Yamagishi |
| 6,384,318 B1 | 5/2002 | Nomura |
| 6,410,843 B1 | 6/2002 | Kishi |
| 6,414,237 B1 | 7/2002 | Boeer |
| 6,420,645 B1 | 7/2002 | Ohtsuka |
| 6,437,235 B1 | 8/2002 | Komori |
| 6,452,091 B1 | 9/2002 | Nakagawa |
| 6,455,347 B1 | 9/2002 | Hiraishi |
| 6,462,265 B1 | 10/2002 | Sasaoka |
| 6,465,724 B1 | 10/2002 | Garvison |
| 6,469,242 B1 | 10/2002 | Kondo |
| 6,521,821 B2 | 2/2003 | Makita |
| 6,525,262 B1 | 2/2003 | Makita |
| 6,525,264 B2 | 2/2003 | Ouchida |
| 6,528,718 B2 | 3/2003 | Yoda |
| 6,538,959 B1 | 3/2003 | Yamaguchi |
| 6,606,830 B2 | 8/2003 | Nagao |
| 6,607,936 B2 | 8/2003 | Nomura |
| 6,653,549 B2 | 11/2003 | Matsushita |
| 6,653,550 B2 | 11/2003 | Hayashi |
| 6,653,553 B2 | 11/2003 | Reimer |
| 6,657,118 B2 | 12/2003 | Toyomura |
| 6,660,930 B1 | 12/2003 | Gonsiorawski |
| 6,670,787 B2 | 12/2003 | Tachibana |
| 6,672,018 B2 | 1/2004 | Shingleton |
| 6,673,997 B2 | 1/2004 | Blieske |
| 6,696,636 B2 | 2/2004 | Yoshikawa |
| 6,720,576 B2 | 4/2004 | Nakajima |
| 6,747,203 B2 | 6/2004 | Fukuda |
| 6,750,391 B2 | 6/2004 | Bower |
| 6,784,361 B2 | 8/2004 | Carlson |
| 6,791,024 B2 | 9/2004 | Toyomura |
| 6,800,801 B2 | 10/2004 | Sasaoka |
| 6,803,514 B2 | 10/2004 | Takeyama |
| 6,818,820 B2 | 11/2004 | Matsushita |
| 6,822,157 B2 | 11/2004 | Fujioka |
| 6,870,087 B1 | 3/2005 | Gallagher |
| 6,930,238 B2 | 8/2005 | Makita |
| 7,012,188 B2 | 3/2006 | Erling |
| 7,022,910 B2 | 4/2006 | Gaudiana |

(56) References Cited

U.S. PATENT DOCUMENTS

| | | |
|---|---|---|
| 7,026,542 B2 | 4/2006 | Kageyama |
| 7,033,655 B2 | 4/2006 | Beteille |
| 7,161,082 B2 | 1/2007 | Matsushita |
| 7,202,410 B2 | 4/2007 | Umemoto |
| 7,235,736 B1 | 6/2007 | Buller |
| 7,238,878 B2 | 7/2007 | Gonsiorawski |
| 7,238,879 B2 | 7/2007 | Matsushita |
| 7,253,355 B2 | 8/2007 | Schwirtlich |
| 7,259,322 B2 | 8/2007 | Gronet |
| 7,388,146 B2 | 6/2008 | Fraas |
| 7,394,016 B2 | 7/2008 | Gronet |
| 7,432,438 B2 | 10/2008 | Rubin |
| 7,435,897 B2 | 10/2008 | Russell |
| 7,442,872 B2 | 10/2008 | Umemoto |
| 7,449,629 B2 | 11/2008 | Ferri |
| 7,465,873 B2 | 12/2008 | Nomura |
| 7,487,771 B1 | 2/2009 | Eiffert |
| 7,506,477 B2 | 3/2009 | Flaherty |
| 7,509,775 B2 | 3/2009 | Flaherty |
| 7,531,740 B2 | 5/2009 | Flaherty |
| 7,557,291 B2 | 7/2009 | Flaherty |
| 7,574,842 B2 | 8/2009 | Russell |
| 7,592,537 B1 | 9/2009 | West |
| 7,612,283 B2 | 11/2009 | Toyomura |
| 7,642,449 B2 | 1/2010 | Korman |
| 7,678,990 B2 | 3/2010 | McCaskill |
| 7,678,991 B2 | 3/2010 | McCaskill |
| 7,714,224 B2 | 5/2010 | Abe |
| 7,745,722 B2 | 6/2010 | Warfield |
| 7,754,962 B2 | 7/2010 | Okamoto |
| 7,762,832 B2 | 7/2010 | Minnick |
| 7,763,917 B2 | 7/2010 | De Rochemont |
| 7,774,998 B2 | 8/2010 | Aschenbrenner |
| 7,804,020 B2 | 9/2010 | Yagiura |
| 7,812,247 B2 | 10/2010 | Armstrong |
| 7,829,783 B2 | 11/2010 | Krajewski |
| 7,847,185 B2 | 12/2010 | Schwarze |
| 7,851,693 B2 | 12/2010 | Fork |
| 7,856,769 B2 | 12/2010 | Plaisted |
| 7,868,246 B2 | 1/2011 | Buechel |
| 7,872,192 B1 | 1/2011 | Fraas |
| 7,900,407 B2 | 3/2011 | Plaisted |
| 7,902,301 B2 | 3/2011 | Kempe |
| 7,902,454 B2 | 3/2011 | Kinoshita |
| 7,906,722 B2 | 3/2011 | Fork |
| 7,910,822 B1 | 3/2011 | Funcell |
| 7,935,884 B2 | 5/2011 | Oi |
| 7,952,016 B2 | 5/2011 | Higuchi |
| 7,956,279 B2 | 6/2011 | Morita |
| 7,960,643 B2 | 6/2011 | Krajewski |
| 7,982,128 B2 | 7/2011 | Umemoto |
| 7,999,174 B2 | 8/2011 | Moslehi |
| 7,999,175 B2 | 8/2011 | Nakayashiki |
| 8,013,237 B2 | 9/2011 | Li |
| 8,013,239 B2 | 9/2011 | Rubin |
| 8,030,119 B2 | 10/2011 | Ravi |
| 8,035,027 B2 | 10/2011 | Moslehi |
| 8,048,520 B2 | 11/2011 | Hayes |
| 8,049,099 B2 | 11/2011 | Hishida |
| 8,053,662 B2 | 11/2011 | Khazeni |
| 8,053,665 B2 | 11/2011 | Moslehi |
| 8,061,091 B2 | 11/2011 | Botkin |
| 8,063,299 B2 | 11/2011 | Haga |
| 8,063,301 B2 | 11/2011 | Hikosaka |
| 8,065,844 B2 | 11/2011 | Botkin |
| 8,067,295 B2 | 11/2011 | Yagiura |
| 8,067,688 B2 | 11/2011 | Gronet |
| 8,080,728 B2 | 12/2011 | Lenges |
| 8,109,048 B2 | 2/2012 | West |
| 8,119,901 B2 | 2/2012 | Jang |
| 8,119,902 B2 | 2/2012 | Gibson |
| 8,141,306 B2 | 3/2012 | Masuda |
| 8,143,361 B2 | 3/2012 | Bergmann |
| 8,153,884 B2 | 4/2012 | Tsunomura |
| 8,156,697 B2 | 4/2012 | Miros |
| 8,156,994 B2 | 4/2012 | Armstrong |
| 8,183,329 B2 | 5/2012 | Kempe |
| 8,183,458 B2 | 5/2012 | Beck |
| 8,186,111 B2 | 5/2012 | Flaherty |
| 8,197,933 B2 | 6/2012 | Debergalis |
| 8,217,257 B2 | 7/2012 | Jaus |
| 8,220,210 B2 | 7/2012 | Botkin |
| 8,227,688 B1 | 7/2012 | Funcell |
| 8,234,824 B2 | 8/2012 | Botkin |
| 8,240,109 B2 | 8/2012 | Cusson |
| 8,256,170 B2 | 9/2012 | Plaisted |
| 8,261,496 B2 | 9/2012 | Sahlin |
| 8,266,848 B2 | 9/2012 | Miros |
| 8,287,995 B2 | 10/2012 | Shibuya |
| 8,291,654 B2 | 10/2012 | Botkin |
| 8,294,022 B2 | 10/2012 | Lenox |
| 8,304,644 B2 | 11/2012 | Wares |
| 8,307,606 B1 | 11/2012 | Rego |
| 8,307,819 B2 | 11/2012 | Bihler |
| 8,314,323 B2 | 11/2012 | Hishida |
| 8,314,324 B2 | 11/2012 | Tell |
| 8,314,328 B1 | 11/2012 | Jacobs |
| 8,316,593 B2 | 11/2012 | Smith |
| 8,316,618 B1 | 11/2012 | Rodowca |
| 8,316,619 B1 | 11/2012 | Rego |
| 8,319,094 B2 | 11/2012 | Hayes |
| 8,336,277 B1 | 12/2012 | Rego |
| 8,338,697 B2 | 12/2012 | Hoya |
| 8,341,895 B2 | 1/2013 | Schwarze |
| 8,344,239 B2 | 1/2013 | Plaisted |
| 8,362,353 B2 | 1/2013 | Kourtakis |
| 8,375,654 B1 | 2/2013 | West |
| 8,381,466 B2 | 2/2013 | Ehbing |
| 8,394,650 B2 | 3/2013 | Chung |
| 8,404,968 B2 | 3/2013 | Kanbara |
| 8,410,350 B2 | 4/2013 | Corrales |
| 8,418,416 B2 | 4/2013 | Hirayama |
| 8,418,418 B2 | 4/2013 | Willham |
| 8,420,218 B2 | 4/2013 | Nattermann |
| 8,420,927 B2 | 4/2013 | Lee |
| 8,426,724 B2 | 4/2013 | Nakayashiki |
| 8,426,726 B2 | 4/2013 | Taira |
| 8,434,276 B2 | 5/2013 | Sahlin |
| 8,448,391 B2 | 5/2013 | Botkin |
| 8,450,601 B2 | 5/2013 | Li |
| 8,453,394 B2 | 6/2013 | Kobayashi |
| 8,455,752 B2 | 6/2013 | Korman |
| 8,461,450 B2 | 6/2013 | Okamoto |
| 8,479,458 B2 | 7/2013 | Morita |
| 8,481,357 B2 | 7/2013 | Kumar |
| 8,481,844 B2 | 7/2013 | Nishida |
| 8,497,419 B2 | 7/2013 | Ishiguro |
| 8,516,754 B2 | 8/2013 | Botkin |
| 8,522,490 B1 | 9/2013 | Stancel |
| 8,528,277 B2 | 9/2013 | Schwarze |
| 8,530,738 B2 | 9/2013 | Hayase |
| 8,530,740 B2 | 9/2013 | Debije |
| 8,534,007 B2 | 9/2013 | Almy |
| 8,536,442 B2 | 9/2013 | Stancel |
| 8,541,254 B2 | 9/2013 | Hong |
| 8,546,681 B2 | 10/2013 | Wares |
| 8,563,847 B2 | 10/2013 | Meyer |
| 8,563,848 B1 | 10/2013 | Wen |
| 8,567,134 B1 | 10/2013 | Grushkowitz |
| 8,575,475 B2 | 11/2013 | Sakamoto |
| 8,581,094 B2 | 11/2013 | Patel |
| 8,586,855 B2 | 11/2013 | Park |
| 8,586,860 B2 | 11/2013 | Nakata |
| 8,592,674 B2 | 11/2013 | Hoya |
| 8,592,679 B2 | 11/2013 | Patel |
| 8,597,447 B2 | 12/2013 | Utesch |
| 8,603,838 B2 | 12/2013 | Guedel |
| 8,603,853 B2 | 12/2013 | Nishi |
| 8,609,983 B2 | 12/2013 | Sainoo |
| 8,615,939 B2 | 12/2013 | Seery |
| 8,615,941 B2 | 12/2013 | Botkin |
| 8,630,077 B2 | 1/2014 | Johnston |
| 8,650,813 B2 | 2/2014 | Botkin |
| 8,653,166 B2 | 2/2014 | Strzegowski |

(56) References Cited

U.S. PATENT DOCUMENTS

| | | | |
|---|---|---|---|
| 8,664,514 B2 | 3/2014 | Watters | |
| 8,671,631 B2 | 3/2014 | Schroeder | |
| 8,674,213 B2 | 3/2014 | Beck | |
| 8,683,761 B2 | 4/2014 | Danning | |
| 8,686,280 B2 | 4/2014 | Nakata | |
| 8,697,478 B2 | 4/2014 | Huang | |
| 8,697,981 B2 | 4/2014 | Adriani | |
| 8,701,361 B2 | 4/2014 | Ferrara | |
| 8,710,351 B2 | 4/2014 | Robbins | |
| 8,732,940 B2 | 5/2014 | Franklin | |
| 8,742,249 B2 | 6/2014 | Moslehi | |
| 8,748,727 B2 | 6/2014 | Meyer | |
| 8,753,957 B2 | 6/2014 | Nese | |
| 8,759,663 B2 | 6/2014 | Okamoto | |
| 8,763,346 B2 | 7/2014 | Kuster | |
| 8,766,086 B2 | 7/2014 | Maheshwari | |
| 8,772,625 B2 | 7/2014 | Ikenaga | |
| 8,779,279 B2 | 7/2014 | Nakamura | |
| 8,791,208 B2 | 7/2014 | Nishijima | |
| 2002/0012156 A1 | 1/2002 | Varaprasad | |
| 2003/0000568 A1 | 1/2003 | Gonsiorawski | |
| 2003/0087107 A1 | 5/2003 | Varaprasad | |
| 2004/0195233 A1 | 10/2004 | Gerhardinger | |
| 2005/0049158 A1* | 3/2005 | Cai | C09D 4/00 510/197 |
| 2005/0072455 A1 | 4/2005 | Gerhardinger | |
| 2005/0079326 A1 | 4/2005 | Varaprasad | |
| 2005/0115954 A1 | 6/2005 | Gerhardinger | |
| 2005/0269312 A1 | 12/2005 | Gerhardinger | |
| 2006/0207646 A1 | 9/2006 | Terreau | |
| 2007/0017567 A1* | 1/2007 | Gronet | H01L 31/02167 136/246 |
| 2007/0125415 A1 | 6/2007 | Sachs | |
| 2007/0184284 A1 | 8/2007 | Varaprasad | |
| 2007/0243769 A1 | 10/2007 | Atsmon | |
| 2007/0292708 A1 | 12/2007 | Pereira | |
| 2008/0047604 A1 | 2/2008 | Korevaar | |
| 2008/0094685 A1 | 4/2008 | Varaprasad | |
| 2008/0135089 A1 | 6/2008 | Tsakalakos | |
| 2008/0156365 A1 | 7/2008 | Scholz | |
| 2008/0157283 A1 | 7/2008 | Moslehi | |
| 2008/0175748 A1 | 7/2008 | Pereira | |
| 2008/0178922 A1 | 7/2008 | Gibson | |
| 2008/0210294 A1 | 9/2008 | Moslehi | |
| 2008/0235949 A1 | 10/2008 | Gibson | |
| 2008/0236649 A1 | 10/2008 | Gibson | |
| 2008/0236650 A1 | 10/2008 | Gibson | |
| 2008/0236740 A1 | 10/2008 | Gibson | |
| 2008/0264477 A1 | 10/2008 | Moslehi | |
| 2008/0271776 A1 | 11/2008 | Morgan | |
| 2008/0289682 A1* | 11/2008 | Adriani | B32B 17/10018 136/251 |
| 2008/0289684 A1 | 11/2008 | Moslehi | |
| 2008/0291522 A1 | 11/2008 | Varaprasad | |
| 2008/0295887 A1 | 12/2008 | Moslehi | |
| 2009/0032087 A1* | 2/2009 | Kalejs | H01L 31/0516 136/246 |
| 2009/0065043 A1 | 3/2009 | Hadorn | |
| 2009/0077805 A1 | 3/2009 | Bachrach | |
| 2009/0107545 A1 | 4/2009 | Moslehi | |
| 2009/0114261 A1 | 5/2009 | Stancel | |
| 2009/0114270 A1* | 5/2009 | Stancel | H02S 20/00 136/251 |
| 2009/0183763 A1 | 7/2009 | Meyer | |
| 2009/0194098 A1 | 8/2009 | Placer | |
| 2009/0301549 A1 | 12/2009 | Moslehi | |
| 2009/0314696 A1 | 12/2009 | Trentacosta | |
| 2010/0024874 A1* | 2/2010 | Varaprasad | B32B 17/10 136/256 |
| 2010/0047954 A1 | 2/2010 | Su | |
| 2010/0053723 A1 | 3/2010 | Varaprasad | |
| 2010/0110523 A1 | 5/2010 | Varaprasad | |
| 2010/0116325 A1 | 5/2010 | Nikoonahad | |
| 2010/0126554 A1 | 5/2010 | Morgan | |
| 2010/0163098 A1 | 7/2010 | Clemens | |
| 2010/0236165 A1 | 9/2010 | Smith | |
| 2010/0236541 A1 | 9/2010 | Smith | |
| 2010/0236542 A1 | 9/2010 | Pierson | |
| 2010/0282293 A1 | 11/2010 | Meyer | |
| 2010/0294340 A1 | 11/2010 | Cunningham | |
| 2010/0304521 A1 | 12/2010 | Seutter | |
| 2011/0011449 A1 | 1/2011 | Morgan | |
| 2011/0014501 A1 | 1/2011 | Scheucher | |
| 2011/0045172 A1 | 2/2011 | Varaprasad | |
| 2011/0094171 A1 | 4/2011 | Burkhardt | |
| 2011/0121441 A1 | 5/2011 | Halstead | |
| 2011/0124145 A1 | 5/2011 | Moslehi | |
| 2011/0132432 A1 | 6/2011 | Schultz | |
| 2011/0144225 A1* | 6/2011 | Stratton | C09D 7/61 522/66 |
| 2011/0151157 A1 | 6/2011 | Koebel | |
| 2011/0162713 A1 | 7/2011 | Morgan | |
| 2011/0189440 A1 | 8/2011 | Appleby | |
| 2011/0214708 A1 | 9/2011 | Yago | |
| 2011/0220182 A1 | 9/2011 | Lin | |
| 2011/0232212 A1 | 9/2011 | Pierson | |
| 2011/0240089 A1 | 10/2011 | Wootton | |
| 2011/0240096 A1 | 10/2011 | Maheshwari | |
| 2011/0253193 A1 | 10/2011 | Korman | |
| 2011/0265867 A1 | 11/2011 | Moslehi | |
| 2011/0272013 A1 | 11/2011 | Moslehi | |
| 2011/0300664 A1 | 12/2011 | Chung | |
| 2011/0308567 A1 | 12/2011 | Chung | |
| 2012/0012160 A1 | 1/2012 | Moslehi | |
| 2012/0017971 A1 | 1/2012 | Moslehi | |
| 2012/0017988 A1 | 1/2012 | Moslehi | |
| 2012/0019942 A1 | 1/2012 | Morgan | |
| 2012/0048335 A1 | 3/2012 | Nakamura | |
| 2012/0067397 A1 | 3/2012 | Shah | |
| 2012/0067398 A1 | 3/2012 | Maheshwari | |
| 2012/0073623 A1 | 3/2012 | Jones | |
| 2012/0075168 A1 | 3/2012 | Osterhout | |
| 2012/0145219 A1 | 6/2012 | Medwick | |
| 2012/0167947 A1 | 7/2012 | Battaglia, Jr. | |
| 2012/0167948 A1 | 7/2012 | Marathe | |
| 2012/0174860 A1 | 7/2012 | Moslehi | |
| 2012/0180867 A1 | 7/2012 | Moslehi | |
| 2012/0186631 A1 | 7/2012 | Terreau | |
| 2012/0194418 A1 | 8/2012 | Osterhout | |
| 2012/0194419 A1 | 8/2012 | Osterhout | |
| 2012/0194420 A1 | 8/2012 | Osterhout | |
| 2012/0194549 A1 | 8/2012 | Osterhout | |
| 2012/0194550 A1 | 8/2012 | Osterhout | |
| 2012/0194551 A1 | 8/2012 | Osterhout | |
| 2012/0194552 A1 | 8/2012 | Osterhout | |
| 2012/0194553 A1 | 8/2012 | Osterhout | |
| 2012/0200488 A1 | 8/2012 | Osterhout | |
| 2012/0200499 A1 | 8/2012 | Osterhout | |
| 2012/0200601 A1 | 8/2012 | Osterhout | |
| 2012/0206322 A1 | 8/2012 | Osterhout | |
| 2012/0206323 A1 | 8/2012 | Osterhout | |
| 2012/0206334 A1 | 8/2012 | Osterhout | |
| 2012/0206335 A1 | 8/2012 | Osterhout | |
| 2012/0206485 A1 | 8/2012 | Osterhout | |
| 2012/0206790 A1 | 8/2012 | Varaprasad | |
| 2012/0211052 A1 | 8/2012 | Marathe | |
| 2012/0212398 A1 | 8/2012 | Border | |
| 2012/0212399 A1 | 8/2012 | Border | |
| 2012/0212400 A1 | 8/2012 | Border | |
| 2012/0212406 A1 | 8/2012 | Osterhout | |
| 2012/0212414 A1 | 8/2012 | Osterhout | |
| 2012/0212484 A1 | 8/2012 | Haddick | |
| 2012/0212499 A1 | 8/2012 | Haddick | |
| 2012/0218172 A1 | 8/2012 | Border | |
| 2012/0218301 A1 | 8/2012 | Miller | |
| 2012/0235883 A1 | 9/2012 | Border | |
| 2012/0235884 A1 | 9/2012 | Miller | |
| 2012/0235885 A1 | 9/2012 | Miller | |
| 2012/0235886 A1 | 9/2012 | Border | |
| 2012/0235887 A1 | 9/2012 | Border | |
| 2012/0235900 A1 | 9/2012 | Border | |
| 2012/0236030 A1 | 9/2012 | Border | |
| 2012/0236031 A1 | 9/2012 | Haddick | |

(56) References Cited

U.S. PATENT DOCUMENTS

| | | |
|---|---|---|
| 2012/0242678 A1 | 9/2012 | Border |
| 2012/0242697 A1 | 9/2012 | Border |
| 2012/0242698 A1 | 9/2012 | Haddick |
| 2012/0249797 A1 | 10/2012 | Haddick |
| 2012/0268087 A1 | 10/2012 | Kernahan |
| 2012/0291835 A1 | 11/2012 | Lu |
| 2012/0291836 A1 | 11/2012 | Lu |
| 2012/0291856 A1 | 11/2012 | Sheats |
| 2012/0295387 A1 | 11/2012 | Lu |
| 2012/0295392 A1 | 11/2012 | Lu |
| 2012/0295393 A1 | 11/2012 | Lu |
| 2012/0295395 A1 | 11/2012 | Lu |
| 2012/0298168 A1 | 11/2012 | Lu |
| 2012/0318319 A1 | 12/2012 | Pinarbasi |
| 2012/0318321 A1 | 12/2012 | Lu |
| 2013/0008482 A1 | 1/2013 | Stancel |
| 2013/0063802 A1 | 3/2013 | Varaprasad |
| 2013/0127980 A1 | 5/2013 | Haddick |
| 2013/0145588 A1 | 6/2013 | Nakata |
| 2013/0146122 A1 | 6/2013 | Chung |
| 2013/0167904 A1 | 7/2013 | Moslehi |
| 2013/0206208 A1 | 8/2013 | Shah |
| 2013/0233383 A1* | 9/2013 | Naumovitz ....... B32B 17/10018 136/259 |
| 2013/0233385 A1* | 9/2013 | Reese ................ H01L 31/05 136/259 |
| 2013/0278631 A1 | 10/2013 | Border |
| 2013/0305528 A1 | 11/2013 | Anderson |
| 2013/0314303 A1 | 11/2013 | Osterhout |
| 2013/0338267 A1 | 12/2013 | Appleby |
| 2014/0014403 A1 | 1/2014 | Miller |
| 2014/0030833 A1 | 1/2014 | Sato |
| 2014/0035373 A1 | 2/2014 | Meyer |
| 2014/0042212 A1 | 2/2014 | Shearer |
| 2014/0063054 A1 | 3/2014 | Osterhout |
| 2014/0063055 A1 | 3/2014 | Osterhout |
| 2014/0113828 A1 | 4/2014 | Gilbert |
| 2014/0147627 A1* | 5/2014 | Aizenberg ........... A61L 15/24 428/141 |
| 2014/0157693 A1 | 6/2014 | Schumacher |
| 2014/0158184 A1 | 6/2014 | West |
| 2014/0166077 A1 | 6/2014 | Gupta |
| 2014/0166099 A1 | 6/2014 | Fang |
| 2014/0182662 A1 | 7/2014 | West |
| 2014/0196766 A1 | 7/2014 | Schumacher |
| 2014/0196768 A1 | 7/2014 | Heng |
| 2014/0216527 A1* | 8/2014 | Happ ................. H01L 31/18 136/251 |
| 2014/0260000 A1* | 9/2014 | Haynes .............. H02S 40/44 52/173.3 |
| 2018/0134476 A1 | 5/2018 | Rosenzweig |
| 2018/0277691 A1* | 9/2018 | Karkkainen ......... G02B 1/111 |

OTHER PUBLICATIONS

Solar, "New Jersey Family's SunPower Rooftop Solar System Pays for Itself," Apr. 2010, (pp. 1-2).
Liquiguard, "EFS-100," Product Brochure, Dec. 2017, (pp. 1-1).
Sun Pacific Power, "Overview of Sun Pacific Power Products," Jan. 2013, (pp. 1-2).
Fraunhofer, "Photovoltaics Report," Jul. 12, 2017, (pp. 1-44).
Liquiguard, "Silicote AP," Product Brochure, Dec. 2017, (pp. 1-2).
Sun Pacific Power, "LED Lighting, the Green Illuminace, Energy Saving," Dec. 2017, (pp. 1-17).
Sun Pacific Power, "5X5 Square Steel Pole," Dec. 2017, (pp. 1-2).
Sun Pacific Power, "Emergency & Exit Lighting," Dec. 2017, (pp. 1-2).
Sun Pacific Power, "The Quad Led Canopy," Dec. 2017, (pp. 1-2).
Sun Pacific Power, "SOLARBIN," Dec. 2017, (pp. 1-2).
Sun Pacific Power, "BSM300M-72 series," Dec. 2017, (pp. 1-2).
Sun Pacific Power, "SPP/PVM220PS," Jun. 2011, (pp. 1-1).
Sun Pacific Power, "Energy Saving Lighting," Dec. 2017, (pp. 1-48).
Kelly Pickerel, "Frameless Modules and How to Mount Them",. Solar Builder Magazine, May 8, 2014, (5 Pages).
Kelly Pickerel, "The 411 on frameless solar modules", Solar Panel World Online, Jan. 23, 2015, (12 Pages).
Canbang, Anhui China, Specification of CBE Model 60M Epoxy Resin Encapsulation Solar Panels Employing PV Modules, Alibaba.com, Dec. 5, 2018, (6 Sheets).
Blue Sun Solar , Hefei China, Specification of Blue Sun Solar Epoxy Resin Encapsulation Solar Panel, http://www.bluesunpv.com, (8 Pages).

* cited by examiner

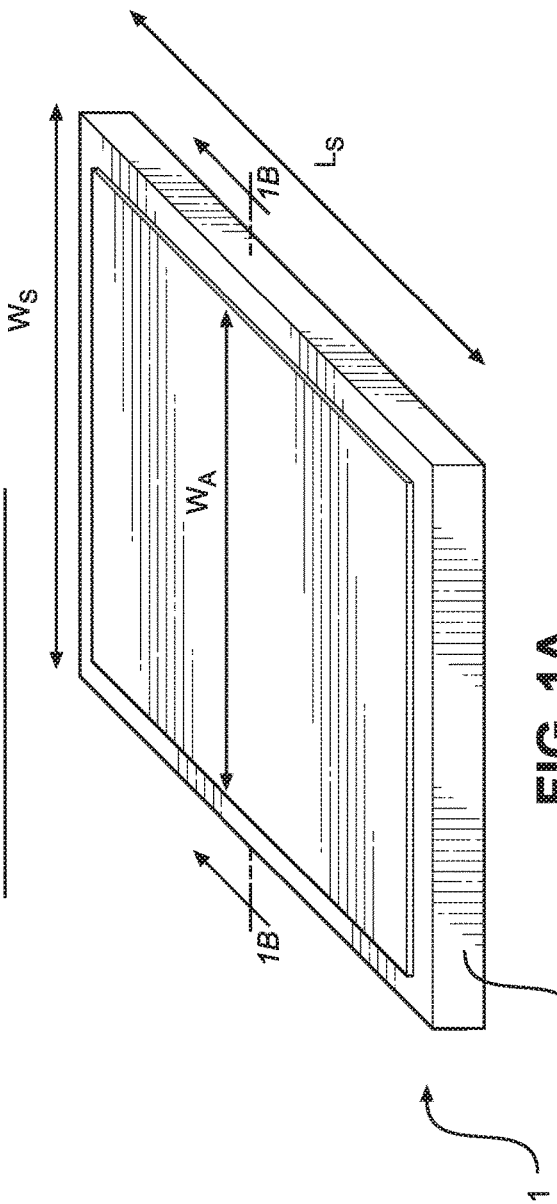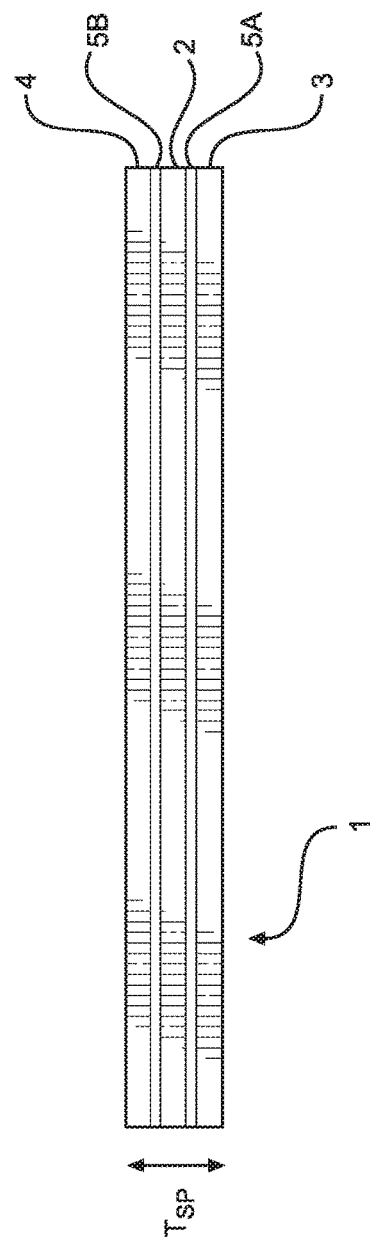
FIG. 1A
(PRIOR ART)
FIG. 1B
(PRIOR ART)

CONVENTIONAL FRAME-LESS DUAL-LAYER GLASS SOLAR PANEL CONSTRUCTION

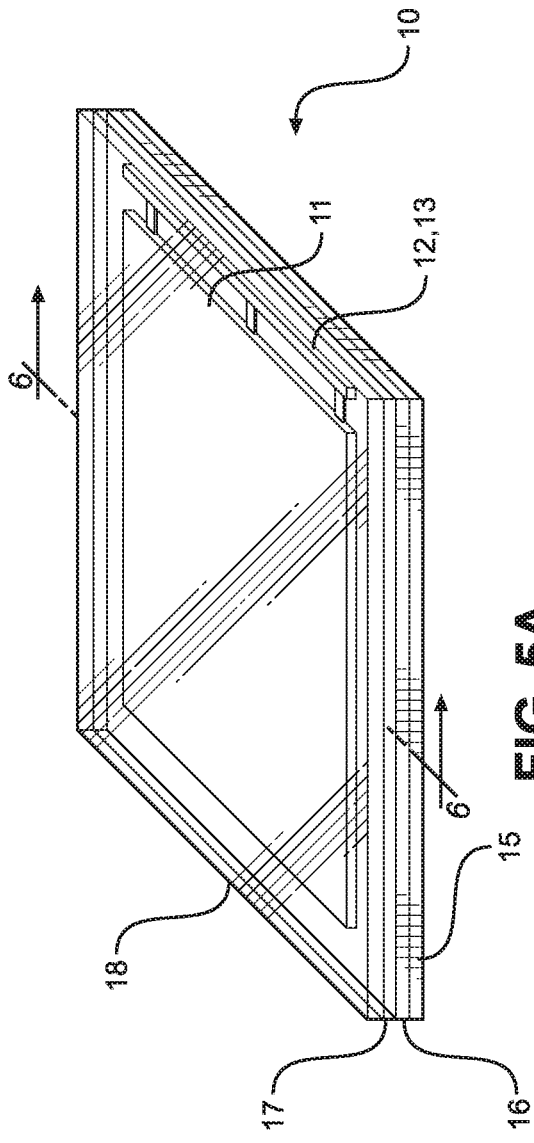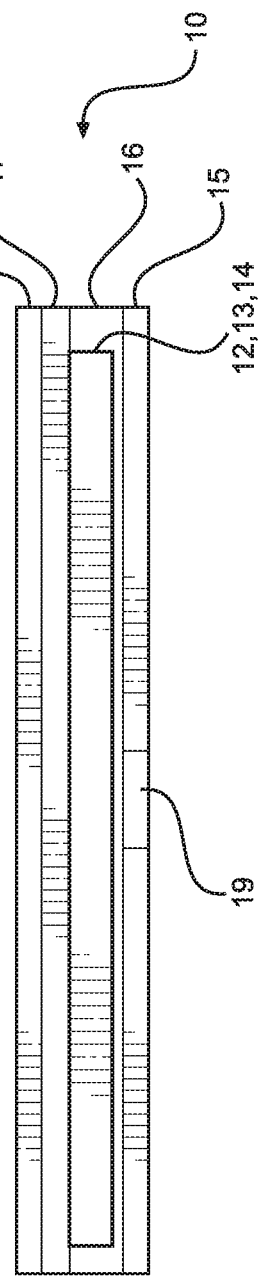
FIG. 5A
FIG. 6

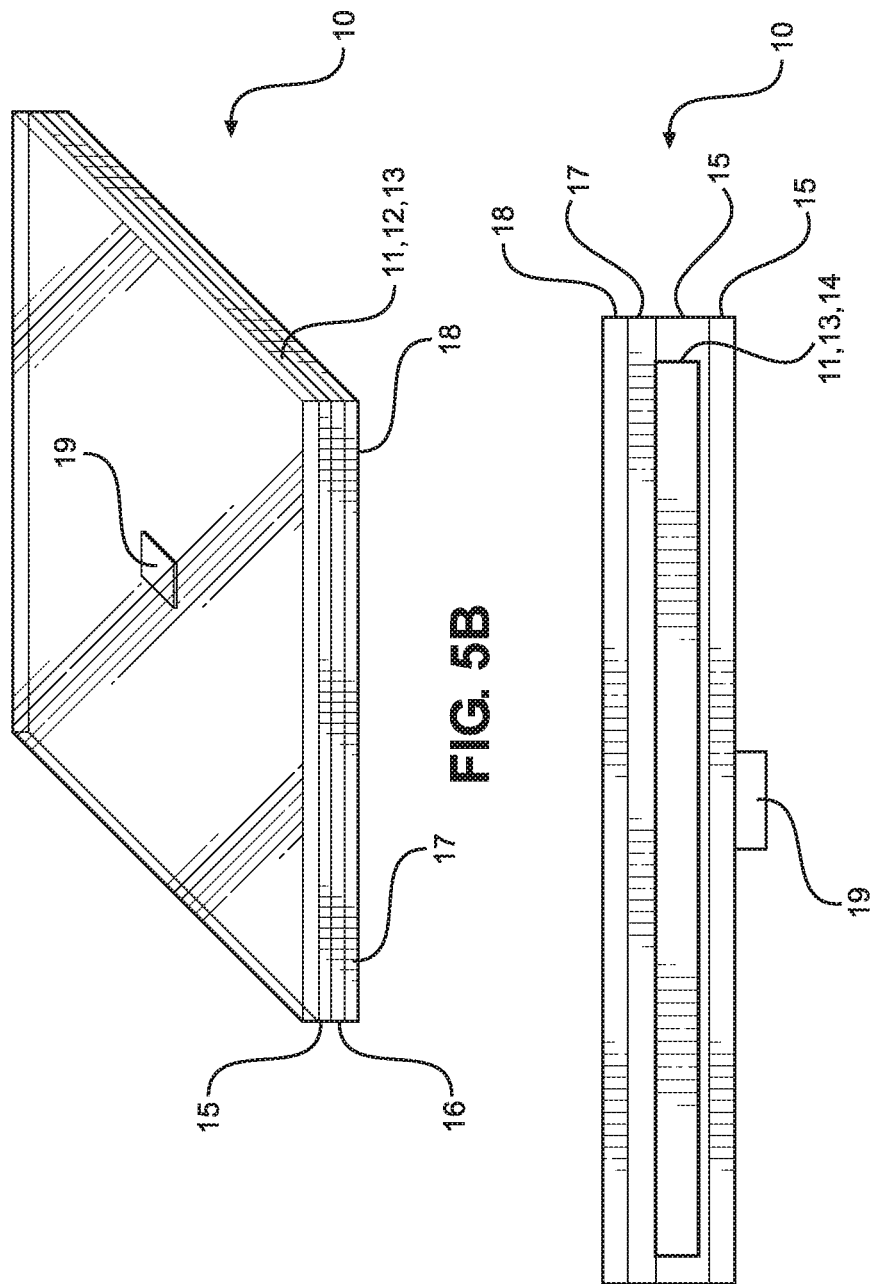

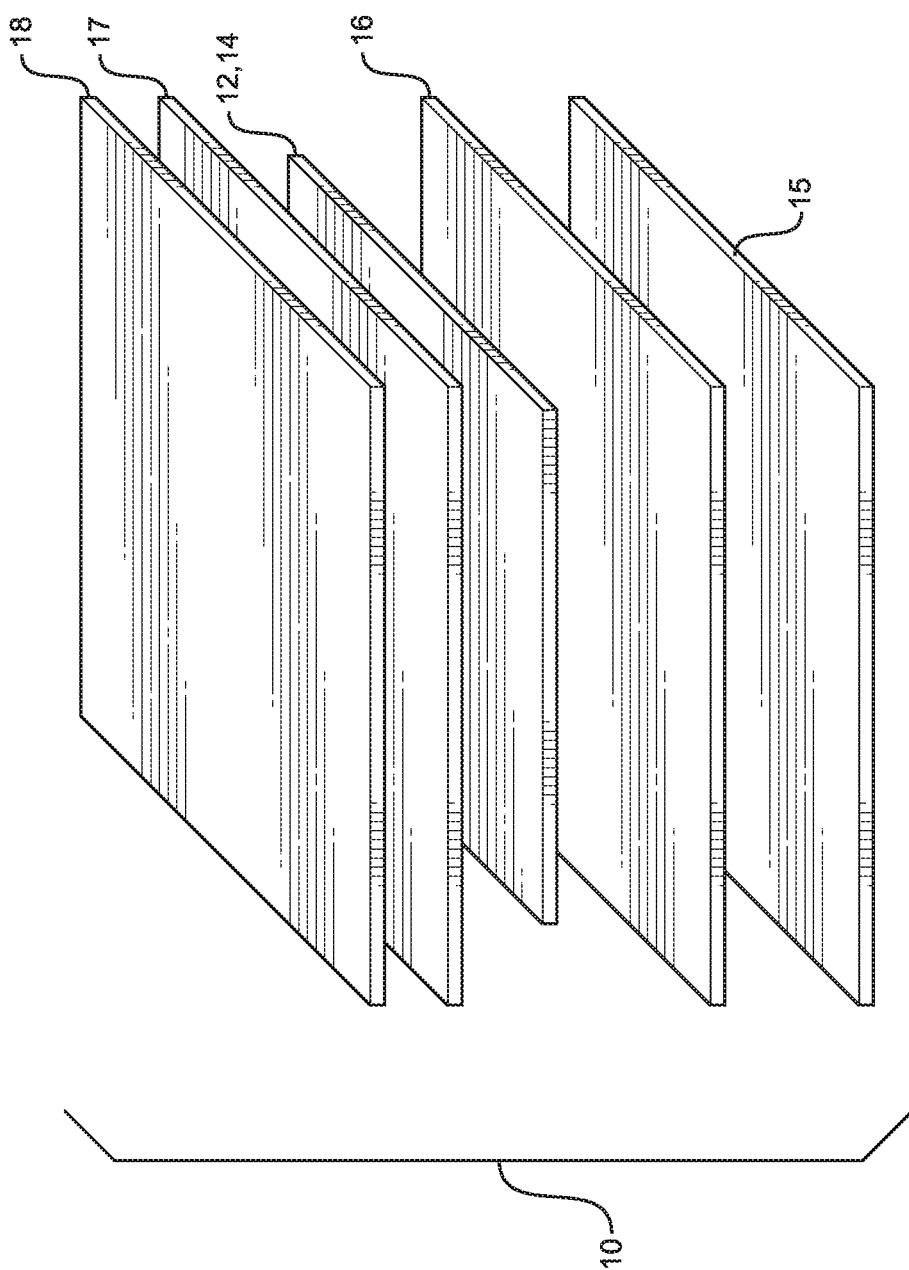

FRAME-LESS EPOXY-RESIN ENCAPSULATED SOLAR PANEL CONSTRUCTION

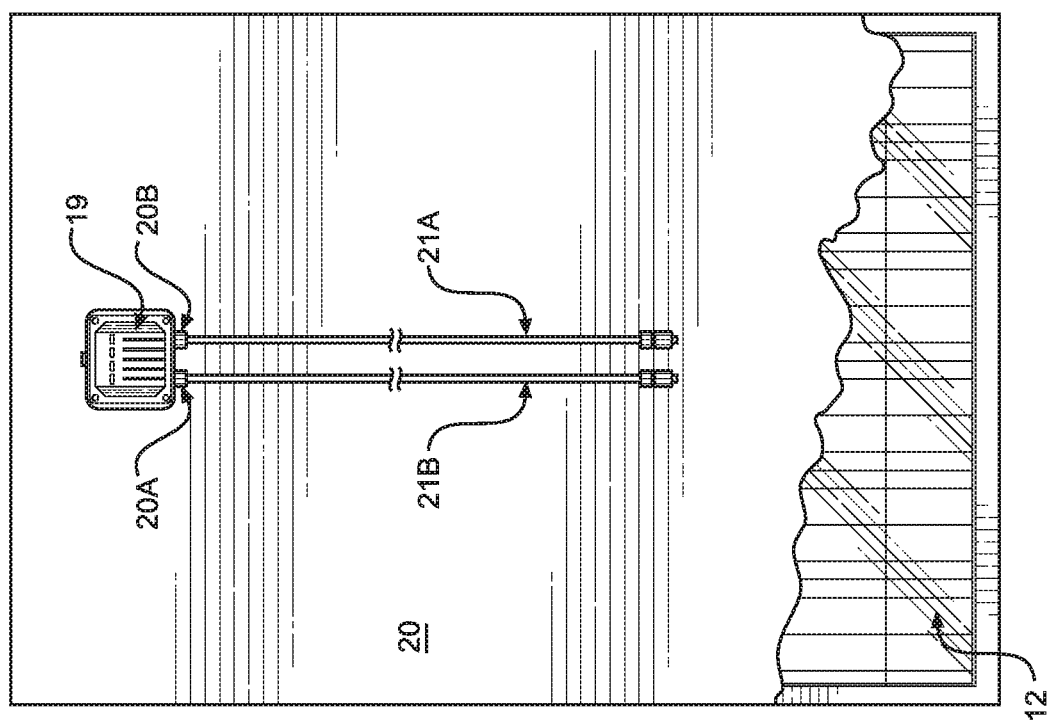

FRAME-LESS ENCAPSULATED PHOTO-VOLTAIC (PV) SOLAR POWER PANEL SUPPORTING SOLAR CELL MODULES ENCAPSULATED WITHIN OPTICALLY-TRANSPARENT EPOXY-RESIN MATERIAL COATING A PHENOLIC RESIN SUPPORT SHEET

RELATED CASES

The present Patent Application is a Continuation of pending U.S. patent application Ser. No. 15/921,458 filed Mar. 14, 2018 titled "FRAME-LESS ENCAPSULATED PHOTO-VOLTAIC SOLAR PANEL CONSTRUCTION AND METHOD AND APPARATUS FOR MAKING THE SAME", commonly owned by Sun Pacific Power Corporation, and incorporated herein by reference as if fully set forth herein.

BACKGROUND OF INVENTION

Field of Invention

The present invention is related to improvements in photo-voltaic solar panel construction, and methods and apparatus for producing the same.

Brief Description of State of the Art

Over the past few decades, the demand for photovoltaic (PV) solar panels has steadily increased with the demand for environmentally clean electrical power generation.

In general, the state of the art in solar panel construction involves mounting PV solar cells or modules on glass substrates encapsulated or laminated using adhesive or like coating. In some applications, the glass-substrates are replaced with reinforced plastic sheets. In other applications, the substrate is realized as a reinforced panel construction, on which the photo-voltaic (PV) solar cell array or module(s) is mounted beneath a top protective panel. These solar panel assemblies are then typically mounted in a framing structure that grips the solar panel assembly at its perimeter. While adding extra weight and depth to the final solar panel assembly, the framing contributes to extra weight, and can make cleaning the exterior surface of the solar panel difficult in most installations.

FIGS. 1A, 1B and 1C shows a conventional framed solar panel construction 1, in which an array of photo-voltaic (PV) cell modules 2 are electrically connected together and laminated between (i) a glass substrate 3 or back support sheet (e.g. Econolite® material), and (ii) an optically transparent top glass panel 4 using an EVA-type adhesive layers 5A and 5B, and embraced within a rigid frame structure 6 made of metal or other rigid material.

FIG. 2 describes the high-level steps involved in carrying out the method of constructing the prior art framed solar panel construction shown.

As indicated at Block A in FIG. 2, the first step involves supplying a stack of glass sheets to the conveyor of a solar panel production line.

As indicated at Block B in FIG. 2, the second step applying a layer of adhesive material to the top surface of support substrate or sheet (e.g. Econolite panel) moving along the conveyor.

As indicated at Block C in FIG. 2, the third step involves arranging a plurality of photo-voltaic (PV) solar cell modules in an array and interconnecting the solar cell modules in electrical series using a set of string-like and tab-like electrical conductors.

As indicated at Block D in FIG. 2, the fourth step involves placing the array of solar cell modules or modules on the layer of adhesive material (e.g. polyethylene-vinyl acetate or EVA) on the support sheet to form a solar panel construction.

As indicated at Block E in FIG. 2, the fifth step involves attaching a set of electrical buses to the edge of the solar panel, and electrical conductors to the electrical buses for attachment to an electrical connector to be mounted on rear of the support sheet.

As indicated at Block F in FIG. 2, the sixth step involves applying a layer of adhesive material (e.g. EVA) over the array of solar cell modules on the support sheet.

As indicated at Block G in FIG. 2, the seventh step involves applying an optically transparent top layer over the array of solar cell modules, and laminating the top layer to the support sheet.

As indicated at Block H in FIG. 2, the eighth step involves mounting the laminated solar panel in a rigid frame structure.

As indicated at Block I in FIG. 2, the ninth step involves mounting an electrical connector to rear surface of the support sheet.

As indicated at Block J in FIG. 2, the tenth step involves testing the solar panel construction under an artificial-sun light source, and determining that solar panel meets its minimum electrical and mechanical performance specifications. Thereafter, the panel assembly is ready for packaging, distribution and shipment to end users.

FIGS. 3A, 3B and 1C shows a conventional frame-less solar panel construction 1', in which an array of photo-voltaic (PV) cell modules 2 are electrically connected together and laminated between (i) a glass substrate 3 or back support sheet (e.g. Econolite® material), and (ii) an optically transparent top glass panel 4 using an EVA-type adhesive layers 5A and 5B.

FIG. 4 describes the high-level steps involved in carrying out the method of constructing the prior art framed-less solar panel construction 1' shown in FIGS. 3A, 3B, 3C and 3D.

As indicated at Block A in FIG. 4, the first step involves supplying a stack of glass sheets to the conveyor of a solar panel production line.

As indicated at Block B in FIG. 4, the second step applying a layer of adhesive material to the top surface of support substrate or sheet (e.g. Econolite panel) moving along the conveyor.

As indicated at Block C in FIG. 4, the third step involves arranging a plurality of photo-voltaic (PV) solar cell modules in an array and interconnecting the solar cell modules in electrical series using a set of string-like and tab-like electrical conductors.

As indicated at Block D in FIG. 4, the fourth step involves placing the array of solar cell modules or modules on the layer of adhesive material (e.g. polyethylene-vinyl acetate or EVA) on the support sheet to form a solar panel construction.

As indicated at Block E in FIG. 4, the fifth step involves attaching a set of electrical buses to the edge of the solar panel, and electrical conductors to the electrical buses for attachment to an electrical connector to be mounted on rear of the support sheet.

As indicated at Block F in FIG. 4, the sixth step involves applying a layer of adhesive material (e.g. EVA) over the array of solar cell modules on the support sheet.

As indicated at Block G in FIG. 4, the seventh step involves applying an optically transparent top layer over the array of solar cell modules, and laminating the top layer to the support sheet.

As indicated at Block H in FIG. 4, the eighth step involves mounting an electrical connector to rear surface of the support sheet.

As indicated at Block I in FIG. 4, the ninth step involves testing the solar panel construction under an artificial-sun light source, and determining that solar panel meets its minimum electrical and mechanical performance specifications. Thereafter, the panel assembly is ready for packaging, distribution and shipment to end users.

While conventional solar panel constructions have advanced over the years in terms of energy generation efficiency, weight and manufacturing requirements have constrained design and performance specifications in many applications.

Clearly, there is a great need for better solar panel construction panel design that is thin, lightweight, sufficiently rigid and strong for mounting in diverse rooftop applications, while overcoming the shortcomings and drawbacks of prior art methods and apparatus.

OBJECTS AND SUMMARY OF THE PRESENT INVENTION

Accordingly, a primary object of the present is to provide a new and improved frame-less epoxy-resin encapsulated solar panel construction, requiring fewer components without edge-based frame structures, while retaining strength and flexibility required in many solar panel applications and overcoming the shortcomings and drawbacks of prior art devices and systems.

Another object of the present invention is to provide such a new and improved frame-less epoxy-resin encapsulated solar panel construction, in which an optically transparent epoxy-resin coating is applied over an array of photo-voltaic (PV) solar cell modules mounted on a sheet of phenolic resin, and supported in a layer of adhesive coating applied as a liquid with a viscosity and a thickness such that the thickness of the layer of adhesive coating is substantially equal to the thickness of the PV solar cell modules, and cured to a sufficient hardness, after which the epoxy-resin coating is applied over the array of PV solar cell modules and the cured layer of adhesive coating so as to reinforce the strength of the sheet of phenolic resin, particularly around the perimeter of the sheet of phenolic resin.

Another object of the present invention is to provide such a new frame-less epoxy-resin encapsulated solar panel construction, in which the optically-transparent epoxy-resin coating is applied over the array of the PV solar cell modules and the cured layer of adhesive coating in an applied thickness sufficient to provide the strength and rigidity required for diverse rooftop applications.

Another object of the present invention is to provide such a new frame-less epoxy-resin encapsulated solar panel construction, in which the edge portions thereof comprise the cured layer of adhesive coating on the sheet of phenolic resin, and the optically-transparent epoxy-resin coating applied over the cured layer of adhesive coating.

Another object of the present invention is to provide a new and improved frame-less epoxy-resin encapsulated solar panel construction comprising an array of photo-voltaic (PV) solar cell modules connected to an electrically-conductive bus bar assembly, adhesively bonded to a sheet of phenolic resin, and encapsulated in a layer of adhesive material having a thickness substantially equal to the array of solar cell modules, and wherein the array of photo cell modules, conductors and buses and adhesive layer are coated with an optically transparent layer of epoxy-resin material which is allowed to partially cure, whereupon a polycarbonate sheet is applied and bonded to the optically transparent layer encapsulating the array of photo cell modules on the phenolic resin sheet, and an optically transparent epoxy resin coating is applied over the polycarbonate sheet to provide a thin clear coating that is hydro-phobic and oleo-phobic to provide self-cleaning action when wet during rain showers.

Another object of the present invention is to provide such a new frame-less epoxy-resin encapsulated solar panel construction, which has sufficient strength and rigidity required for diverse rooftop applications.

Another object of the present invention is to provide such a new frame-less epoxy-resin encapsulated solar panel construction, in which the edge portions of the frame-less epoxy-resin encapsulated solar panel construction can be easily drilled to form mounting holes without the risk of damaging the panel or compromising its strength or integrity.

Another object of the present invention is to provide a novel automated factory system for mass producing frame-less epoxy-resin encapsulated solar panels in a low-cost highly automated manner.

Another object of the present invention is to provide a novel automated process for mass producing frame-less epoxy-resin encapsulated solar panels in a low-cost highly automated manner.

These and other benefits and advantages to be gained by using the features of the present invention will become more apparent hereinafter and in the appended Claims to Invention.

BRIEF DESCRIPTION OF THE DRAWINGS

The following Objects of the Present Invention will become more fully understood when read in conjunction of the Detailed Description of the Illustrative Embodiments, and the appended Drawings, wherein:

FIG. 1A is a perspective view of a conventional rigidly-framed solar panel construction, in which an array of photo-voltaic (PV) cell modules are connected together and laminated between a glass substrate and optically transparent top panel, and embraced within a rigid frame structure;

FIG. 1B is a cross-sectional view of the conventional rigidly-framed solar panel construction shown in FIG. 1A, taken along line 1B-1B indicated in FIG. 1A;

FIG. 5A is a upper perspective view of the first illustrative embodiment of the frame-less epoxy-resin encapsulated solar panel construction of present invention, showing its array of photo-voltaic (PV) solar cell modules connected to an electrically-conductive bus bar assembly, adhesively bonded to a sheet of phenolic resin, and encapsulated in a layer of adhesive material having a thickness substantially equal to the array of solar cell modules, and wherein the array of photo cell modules, conductors and buses, and a thick optically transparent layer of epoxy-resin coating material encapsulating the array of photo cell modules on the phenolic resin sheet;

FIG. 5B is a lower perspective view of the illustrative embodiment of the frame-less epoxy-resin encapsulated solar panel construction of FIG. 5A, showing its rear mounted electrical connector junction box, mounted to the rear of the sheet of phenolic resin;

FIG. 6 is a cross-sectional view of the frame-less epoxy-resin encapsulated solar panel construction of present invention, taken along line 6-6 in FIG. 5A;

FIG. 7 is an elevated side view of the frame-less epoxy-resin encapsulated solar panel construction shown in FIGS. 5A, 5B and 6;

FIG. 8 is an exploded diagram of the frame-less epoxy-resin encapsulated solar panel construction shown in FIGS. 5A and 5B;

FIG. 20 is an elevated rear view of the frame-less epoxy-resin encapsulated solar panel construction shown in FIGS. 15A, 15B, 16, 17 and 18;

DETAILED DESCRIPTION OF THE ILLUSTRATIVE EMBODIMENTS OF THE PRESENT INVENTION

Figure 1C:
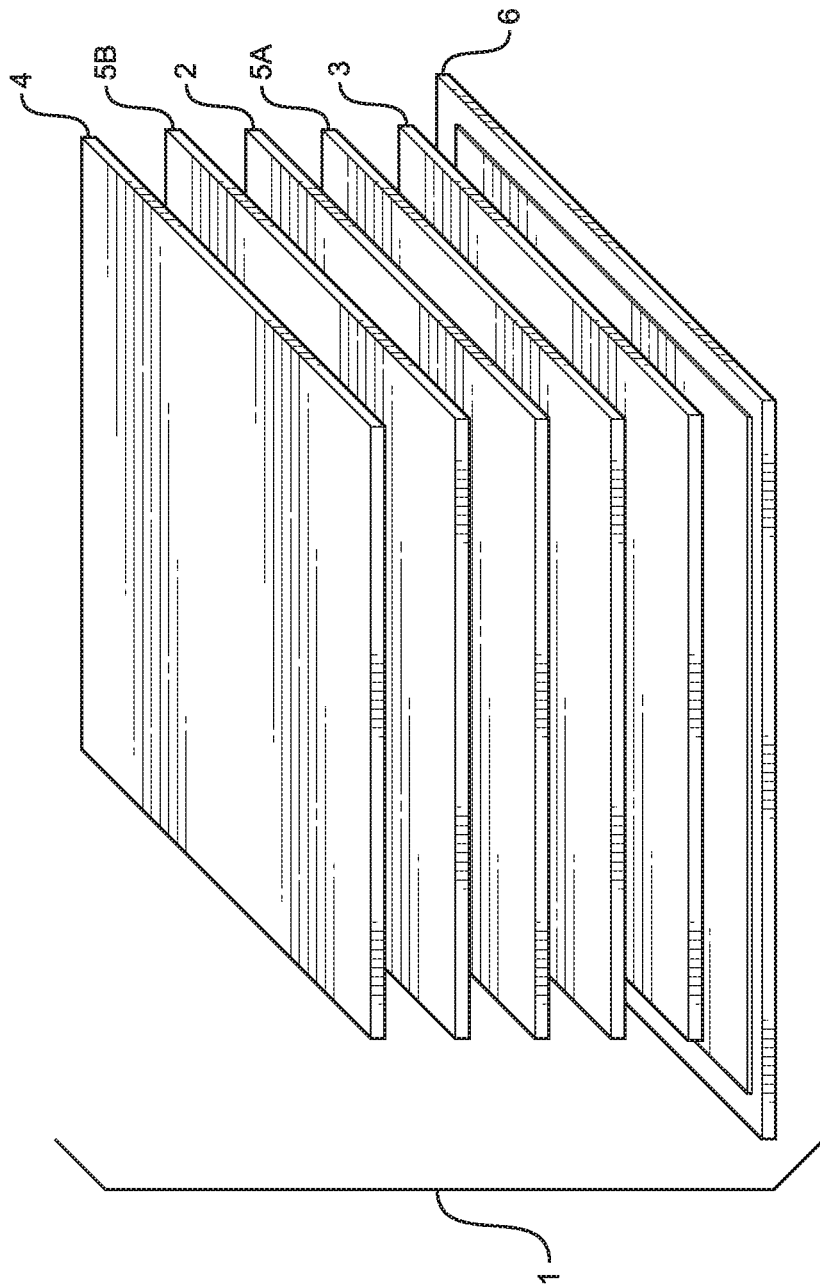
FIG. 1C is an exploded view of the conventional framed solar panel construction shown in FIGS. 1A and 1B.
Figure 2:
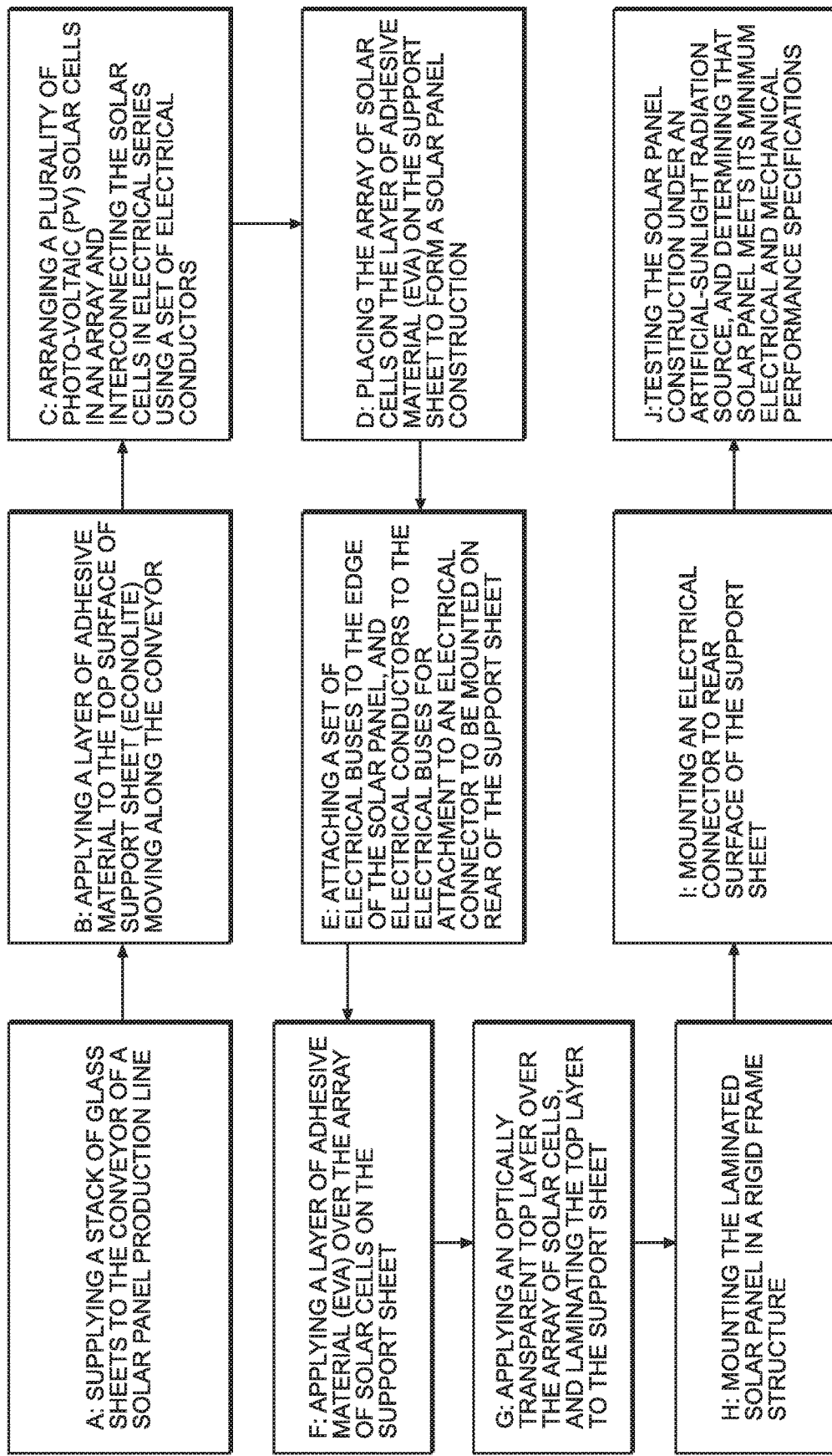
FIG. 2 is a flow chart describing the high-level steps involved in carrying out the prior art method of constructing the prior art rigidly-framed solar panel construction shown in FIGS. 1A, 1B and 1C.
Figure 3A:
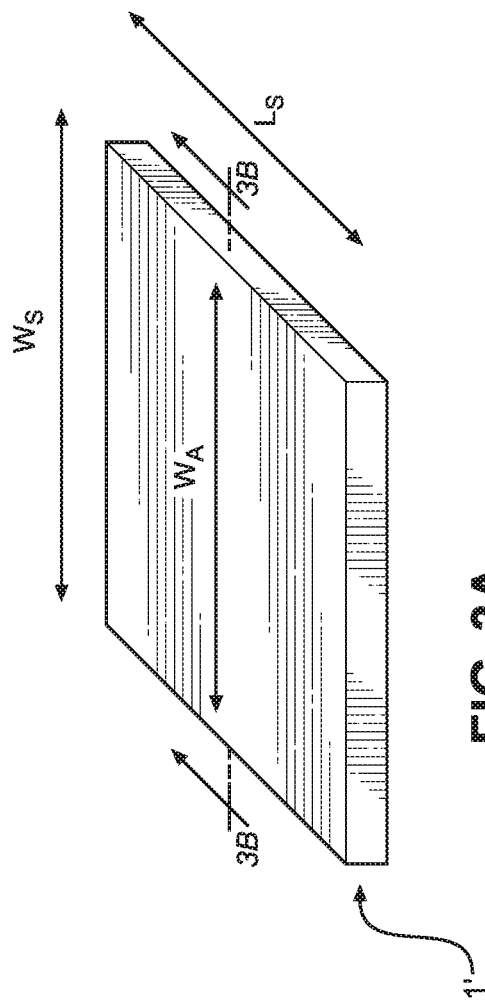
FIG. 3A is a perspective view of a conventional frame-less solar panel construction, in which an array of photo-voltaic (PV) cell modules are connected together and laminated between a glass substrate and optically transparent top panel.
Figure 3B:
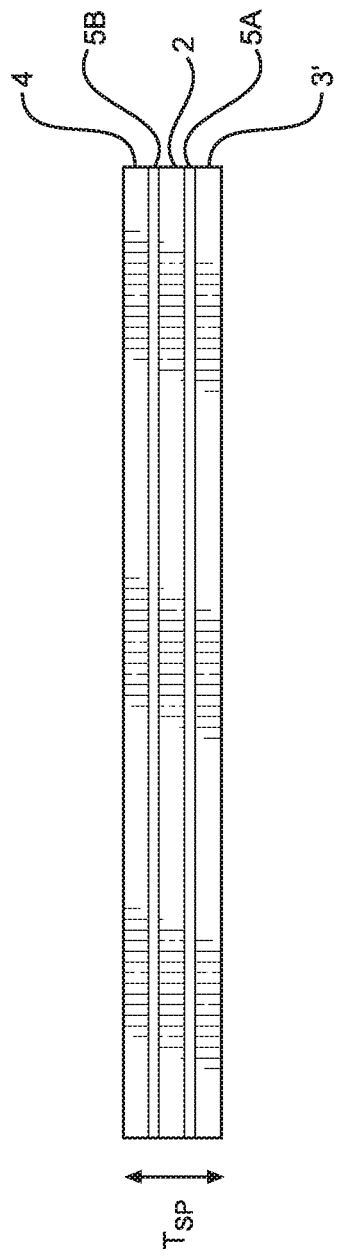
FIG. 3B is a cross-sectional view of the conventional frame-less solar panel construction shown in FIG. 3A, taken along line 3B-3B indicated in FIG. 3A.
Figure 3C:
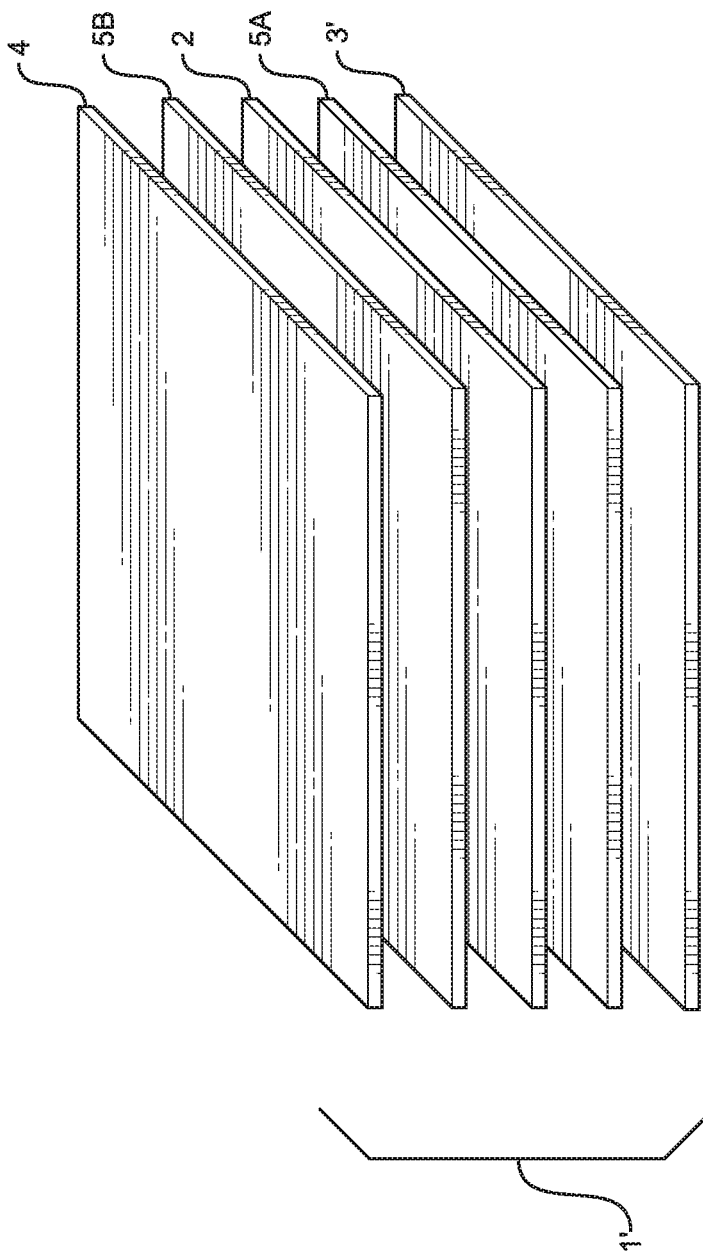
FIG. 3C is an exploded view of the conventional framed solar panel construction shown in FIGS. 3A and 3B.
Figure 3D:
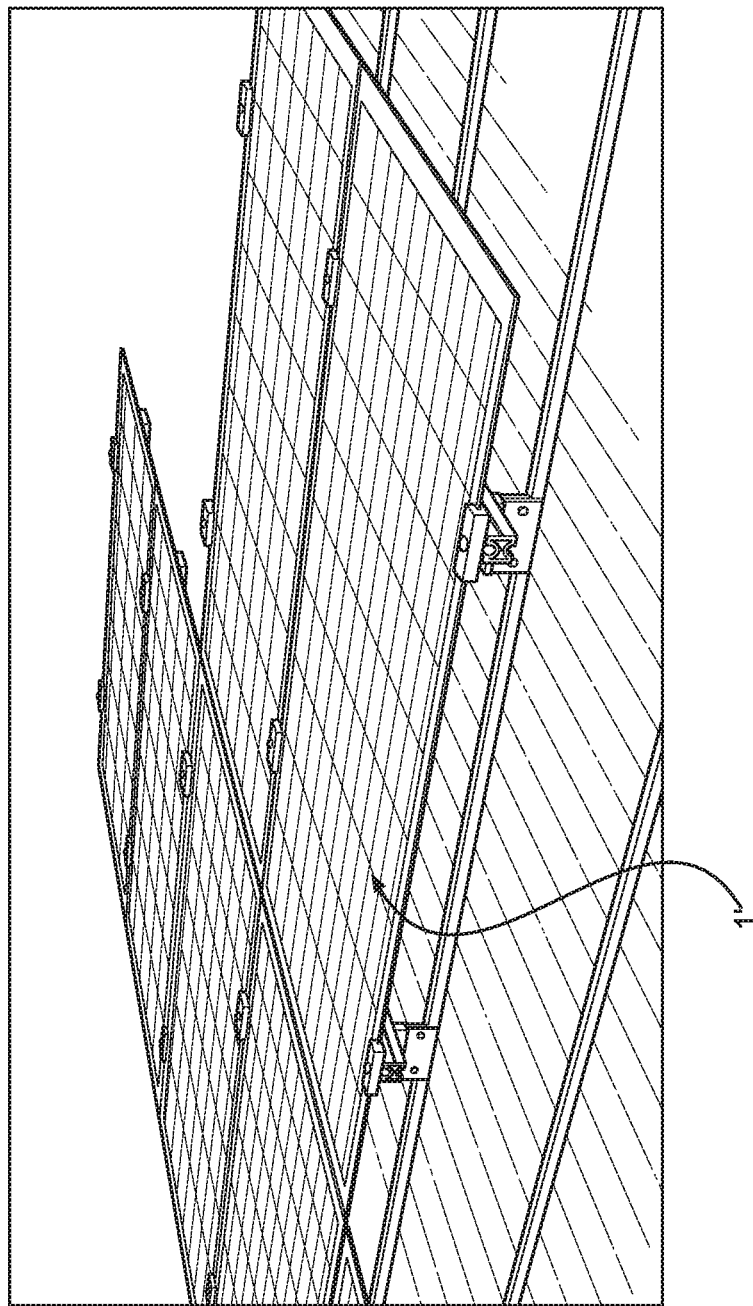
FIG. 3D is a perspective view of the conventional frameless solar panel shown in FIGS. 3A through 3C mounted on a rooftop surface using conventional mounting brackets.
Figure 4:
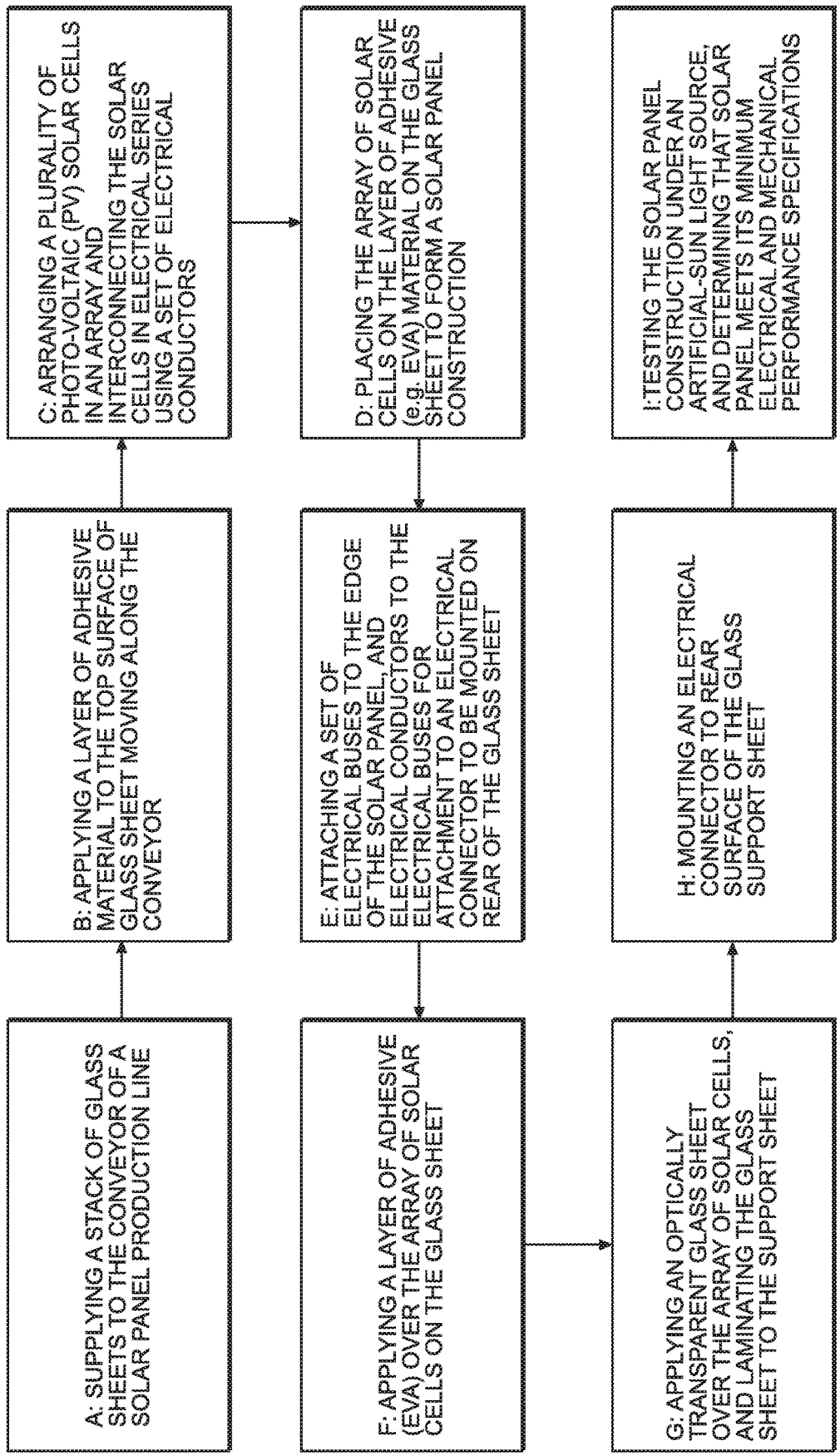
FIG. 4 is a flow chart describing the high-level steps involved in carrying out the prior art method of constructing the prior art frame-less solar panel construction shown in FIGS. 3A, 3B and 3C.

Referring to the accompanying Drawings, like structures and elements shown throughout the figures thereof shall be indicated with like reference numerals.

Figure 11:
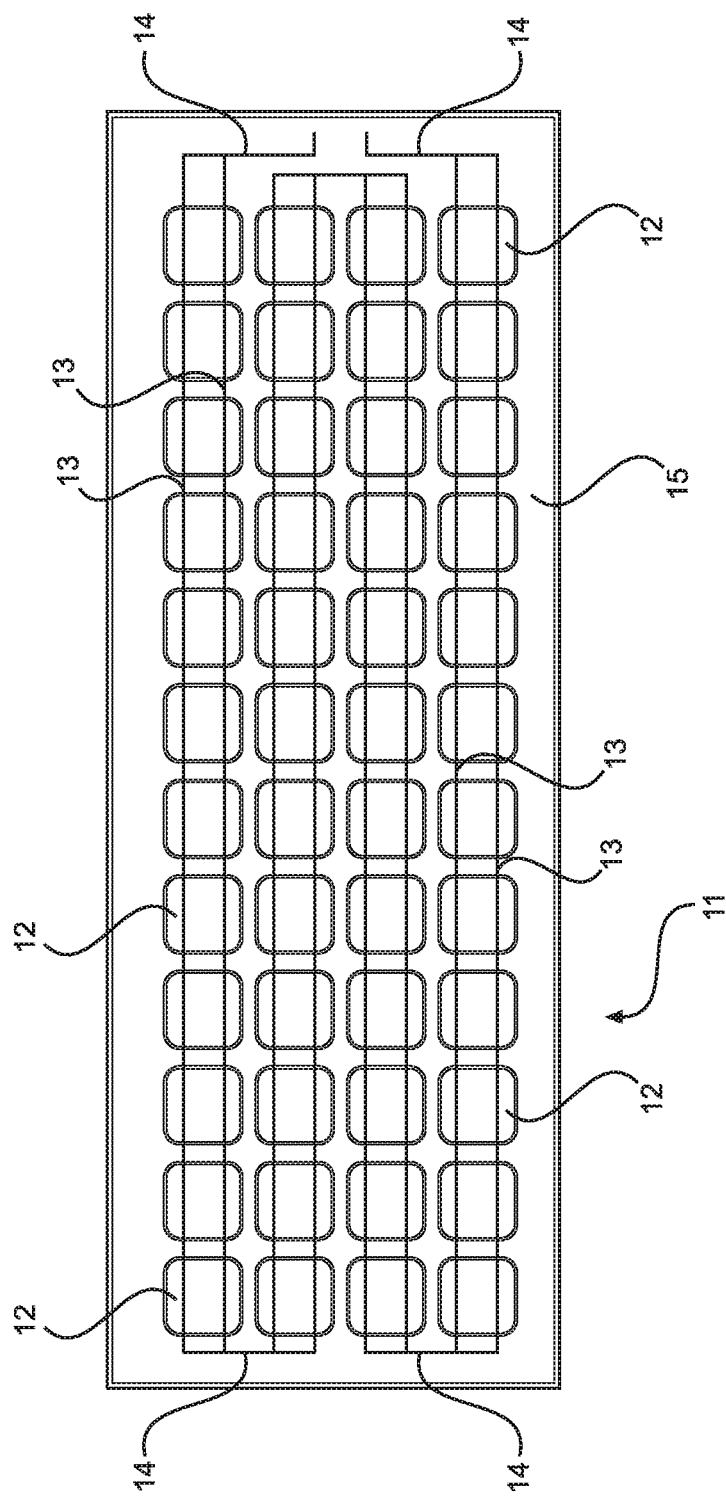
FIG. 11 is a schematic representation of an exemplary solar cell array circuit implemented on a frameless solar panel construction according to the present invention, wherein four electrical circuits connected in electrical series are each formed by connecting 12 PV solar cell modules in electrical parallel configuration.

Specification Of The Frame-Less Epoxy-Resin Encapsulated Solar Panel Construction Of The First Illustrative Embodiment Of The Present Invention FIGS. 5A, 5B, 6 and 7 show the first illustrative embodiment of the frame-less epoxy-resin encapsulated solar panel construction 10 comprising: a PV solar cell array 11 consisting of high-efficiency photo-voltaic (PV) solar cell modules 12 connected to an electrically-conductive bus bar assembly comprising electrical conductive strips 13 and bus bars 14, all realized as thin electrically-conductive elements connected to PV solar cell modules and modules, as illustrated in electrical circuit of FIG. 11.

As shown, the arrays and modules of PV solar cell modules 11 and electrical connectors 13 and buses 14 are adhesively bonded to a non-conductive reinforced sheet of phenolic resin 15 of dimensions (e.g. 99 cm by 196 cm, or 99 cm by 164 cm) of the panel being constructed, using a layer of optically transparent adhesive material (e.g. Liquiguard® FTC-03F coating) 16 applied to the sheet of phenolic resin 175, with a dried film thickness (DFT) substantially equal to the thickness of the array of solar cell modules 11, typically in the range of 150 to 325 microns. Preferably, LiquiGuard® FTC-03F water-based air-dried liquid coating 16 from Liquiguard Technologies, Inc. is used to realize the adhesive coating layer 16. An optically transparent epoxy-resin encapsulating layer (e.g. Liquiguard® Silcote-AP coating) 17 of 1.0 to 1.5 mm thick is applied over the adhesively-bonded array of solar cell modules 12, electrical conductors 13 and buses 14, and adhesive layer coating 16. This encapsulating layer 17 is then allowed to air dry and cure. The curing time for the Liquiguard® Silcote-AP coating 17 will typically take about 3 hours at room temperature. Thereafter, an optically transparent (e.g. clear) epoxy-resin top-protective coating 18 (e.g. Liquiguard® EFS-100 coating) is applied over the optically transparent epoxy-resin (Silcote-AP) coating 17 at a dry film thickness (DFT) of about 0.1 mm, to form a top-protective and self-cleaning coating 18 for the solar panel assembly 10 constructed during the manufacturing process. The resulting PV solar panel assembly construction 10 is frameless, and has high-strength edges that can be drilled, on job sites, with holes for edge mounting in diverse environments including, for example, horizontal and inclined rooftops, as well as vertical wall mounting applications.

In the preferred embodiment, the photo-voltaic solar cell modules 12 are commercially available from various manufacturers and suppliers, and may be made from various photo-voltaic technologies including, for example: (i) mono-crystalline or multi-crystalline silicon photo-voltaic solar cell modules; (ii) copper indium gallium selenide (CIGS) photo-voltaic solar cell modules; (iii) cadmium telluride (CdTe) photo-voltaic solar cell modules; (iv) peroskite photo-voltaic solar cell modules; and (v) organic photo-voltaic solar cell modules, or plastic photo-voltaic solar cell modules.

Preferably, the non-conductive reinforced phenolic resin sheet 15 will have a thickness between ⅛ to 3/16 inches, and provide a support substrate for the solar cell assembly under construction. The reinforced phenolic resin sheet 15 can be made to be clear (i.e. light transparent) or colored with the addition of dye pigment during the manufacturing process. Such reinforced phenolic resin sheets 15 are commercially available from numerous vendors.

Preferably, the adhesive encapsulating layer 16 is realized using the LiquiGuard® FTC-03F water-based/air-dried polymer adhesive coating consisting of a one part system that does not polymerize to achieve adhesive bonding. In this case, the adhesion occurs because of the high tack and phenolic content of the polymer, and the bond is developed through the process of the water content evaporating from the fluid material. In the illustrative embodiment, the Liqui-Guard® FTC-03F adhesive liquid has a viscosity of 3000 cps in its uncured state, with 35% solids, and applied with a dried film thickness (DFT) substantially equal to that of a photo-cell (e.g. 150-325 microns). This condition ensures that the top surfaces of the array of PV photo cell modules and surrounding adhesive coating reside substantially in the same plane, to provide relatively smooth and planar surface characteristics when the PV photo-cell modules 12 and electrical conductors 13 and buses 14 are adhesively mounted to the phenolic resin sheet 15. This liquid adhesive coating 16 can be evaporatively-dried without cross-linking using a drying tunnel on the production line to accelerate drying time, as will be discussed in greater detail hereinafter. When dried/cured, this adhesive coating 16 has high-tensile strength required for the application at hand.

The optically transparent epoxy-resin top-protective coating 18 applied over the adhesive encapsulating coating 17 can be realized using the LiquiGuard® Silcote-AP advanced polymer formulation, from LiquiGuard Technologies, Inc. The LiquiGuard® Silcote-AP coating 17 is an inorganic hybrid two-part coating polymer formulation which, when cured, provides a durable coating that protects the photo-cell array 11 and electrical conductors 13 and buses 14 mounted on the phenolic resin sheet 15. The 2-part Silcote-AP coating 17 is supplied as Part-A and Part-B, where Part-A is the resin and Part-B is the catalyst that enables the curing and hardening of the resin to develop the ultimate physical properties. The mixing ratio is 6:1 and should be strictly maintained in order to ensure optimal functionality. For example, six parts of Part-A can be poured into a plastic or metal container just prior to application. Then one part of Part-B is added to the Part-A in the container and the mix is gently stirred until a clear slightly straw colored liquid is obtained which ensures that the two parts have thoroughly homogenized. This two-part liquid coating can be applied over the photo-cell modules 12 and conductors 13 and buses 14 and cured adhesive encapsulating coating 16 using either a spray applicator, roller, brush or other mechanical coating means preferably under robotic control to achieve the desired thickness.

When using the LiquiGuard® Silcote-AP formulation 17, the manufacturing area should be well ventilated and there should be no exposure to open flames or sparks of any kind. Each gallon of Silcote-AP liquid coating 17 provides a single coat coverage over approximately 750 to 1000 square feet, at approximately 1.5 mil DFT (0.37 mm dry film thickness) depending on the nature of the substrate and method of application. The 'wet edge' or working time of Silcote-AP is approximately 2 hours making it very spray process friendly. It is important to mix only enough material that can be comfortably and properly coated during this time window. The Silcote-AP liquid coating formulation 17 has a 2 to 3 hour working time. Full cure requires approximately 8 hours. The chemical integration of the resin matrix will continue over 48 to 72 hours after application, at which time the Silcote-AP coating will achieve its optimal abrasion, chemical and weather resistant properties.

In the illustrative embodiment, the Liquiguard® EFS-100 coating is a two component formulation, containing 100% solids while emitting a mild odor and zero volatile organic components (VOCs). This top coating formulation 18 has a fine particle size and low-viscosity making it extremely easy to apply using conventional tools such as brush, roller or spray equipment. The EFS-100 product is a carefully engineered with a suggested mix ratio of Part A to Part B specified in the EFS-100 Application Instructions. While the liquid mix has a 'pot life' (i.e. working time) of several hours, the applied coating itself will fully cure in less than an hour. One gallon of EFS-100 mixture can cover approximately 3200 square feet when applied at a 10 micron (0.1 mm) dry film thickness (DFT). The EFS-100 mixture is available in either a gloss or matte finish, and has outstanding durability.

FIG. 8 shows the frame-less epoxy-resin encapsulated solar panel construction of FIGS. 5A and 5B in exploded form. As shown, the solar panel construction comprises: the non-conductive reinforced phenolic resin sheet 15 having physical dimension (Laws) the size of the panel construction, with thickness generally between ⅛ to 3/16 of an inch; the adhesive encapsulating layer 16 deposited on the substrate sheet 15; the array 11 of PV photo cell modules and modules 12, connected together with conductive strips 13 and buses 14; and the clear epoxy-resin coating layer 17 realized using two-component hybrid polysioxane clear coating (e.g. Silcote-AP) applied to 1.0 to 1.25 mm thickness, and allowed to dry; and the clear epoxy resin top protective coating 18, applied at a thickness of about 0.1 mm, dry film thickness (DFT), preferably extremely hydrophobic, oleo-phobic and ice-phobic, preventing dirt and other contaminants from bonding to the surface, and enable easy cleaning and self-cleaning during rain showers.

When using the LiquiGuard® system of adhesive and epoxy-resin products described above (i.e. LiquiGuard® FTC-03F adhesive liquid, LiquiGuard® Silcote-AP epoxy-resin formulation, and LiquiGuard® EFS-100 epoxy-resin formulation), it is expected that none of these components of the frameless encapsulated epoxy-resin PV solar panel construction 10 of the first illustrative embodiment will discolor or yellow during the lifetime of the frameless solar panel construction, and otherwise remain optically transparent and crystal clear, unlike conventional epoxy-resin based systems known in the art. The advantage of this system will be a more attractive looking product with great aesthetic value to the consumer, and less filtering of solar radiation energy from the Sun, and therefore improving the energy conversion efficiency.

Figure 9B:
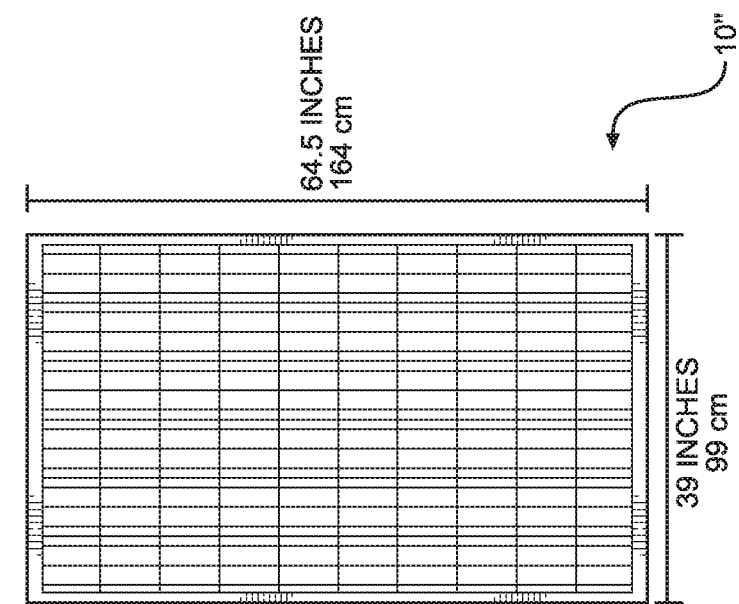
FIG. 9B is a plan view of a frameless solar panel construction of the first illustrative embodiment of the present invention, supporting 60 cell solar cell array, measuring 64.5 inches×39 inches (164 cm×99 cm)
Figure 9A:
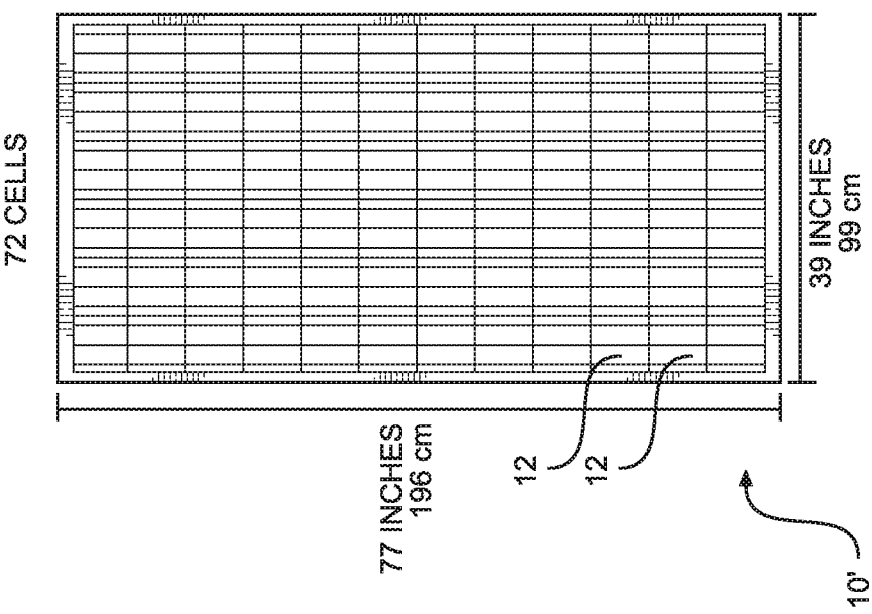
FIG. 9A is a plan view of a frameless solar panel construction of the first illustrative embodiment of the present invention, supporting 72 cell solar cell array, measuring 77 inches×39 inches (196 cm×99 cm)
Figure 10:
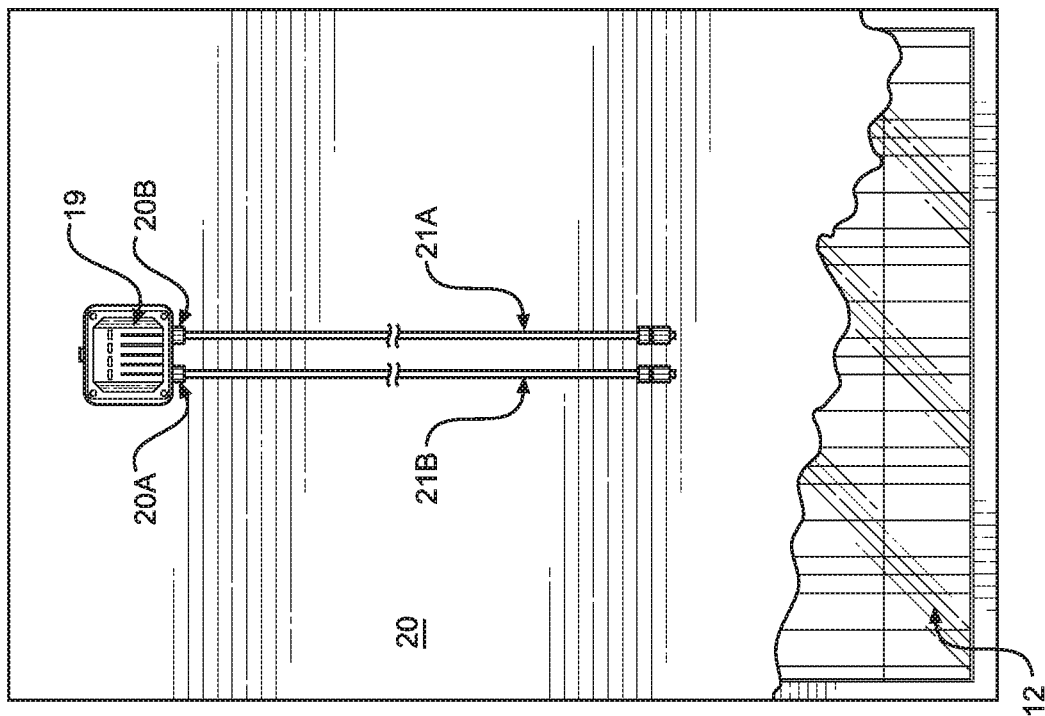
FIG. 10 is an elevated rear view of the frame-less epoxy-resin encapsulated solar panel construction shown in FIGS. 5A, 5B, 6, 7 and 8.

FIG. 9A shows a frameless solar panel construction of the first illustrative embodiment of the present invention 10, supporting a 72 PV cell solar cell array, measuring 77 inches×39 inches (196 cm×99 cm). FIG. 9B shows a frameless PV solar panel construction of the first illustrative embodiment of the present invention, supporting a 60 cell solar cell array, measuring 64.5 inches×39 inches (164 cm×99 cm). FIG. 11 shows how the PV solar cell modules may be electrically connected to construct a solar power generating circuit with the desired voltage and current (V−I) characteristics required by the application at hand. The frameless PV solar panel construction of the present invention can be made to any size, for virtually any application. FIG. 10 shows the rear side of the frame-less epoxy-resin encapsulated solar panel 10 shown in FIGS. 5A, 5B, 6, 7 and 8, and more particularly its electrical junction box 19 mounted to rear surface thereof 20 using conventional mounting methods. The function of the junction box 19 is to support electrical power jacks 21A and 21B for connection of electrical power cables 22A and 22B that connect each solar panel device 10 to an electrical power system supported within the building, house or other environment, in which the solar panel device is be installed.

Figure 12:
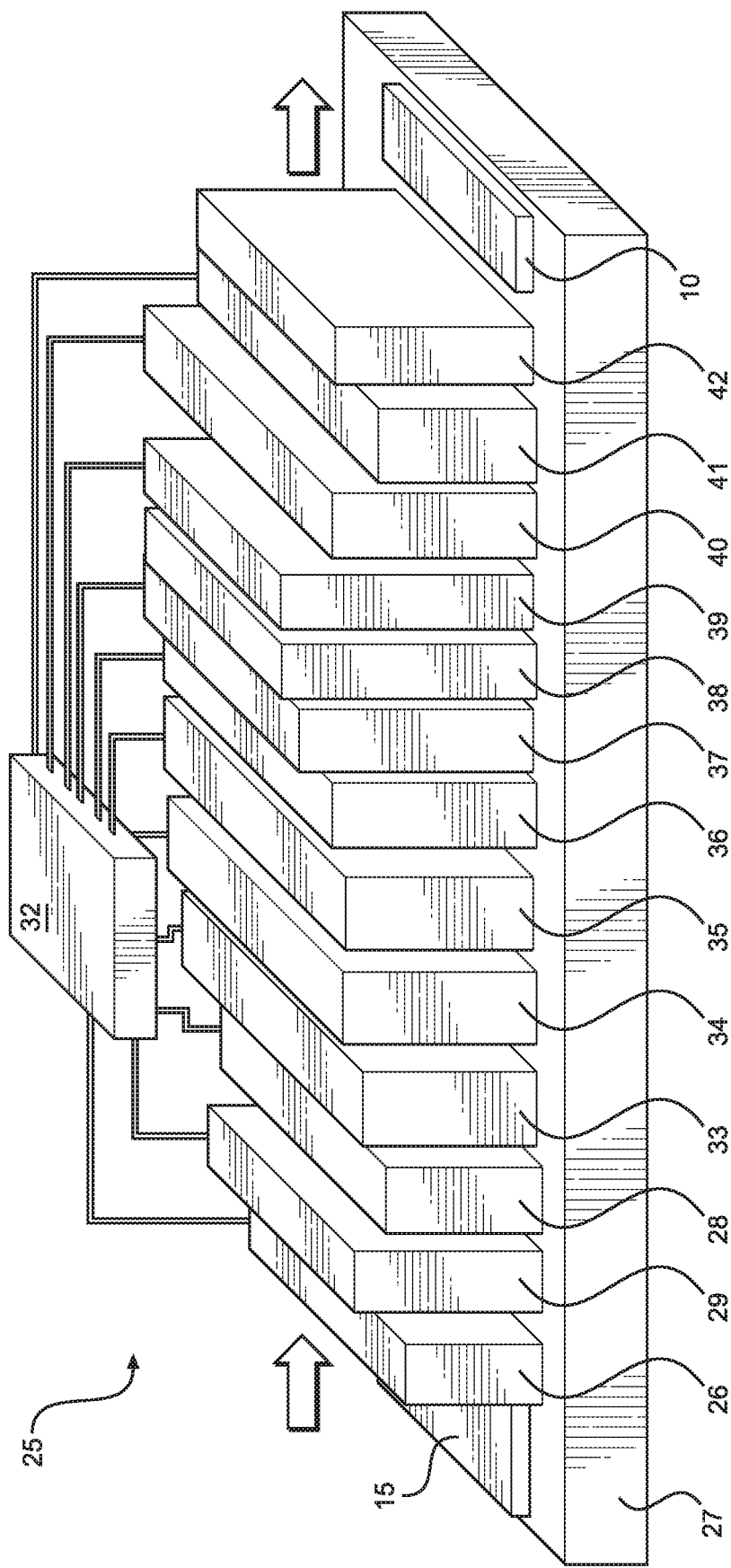
FIG. 12 is a schematic diagram of the solar panel factory system of the present invention for constructing the frame-less epoxy-resin encapsulated solar panel construction of the present invention.
Figure 13:
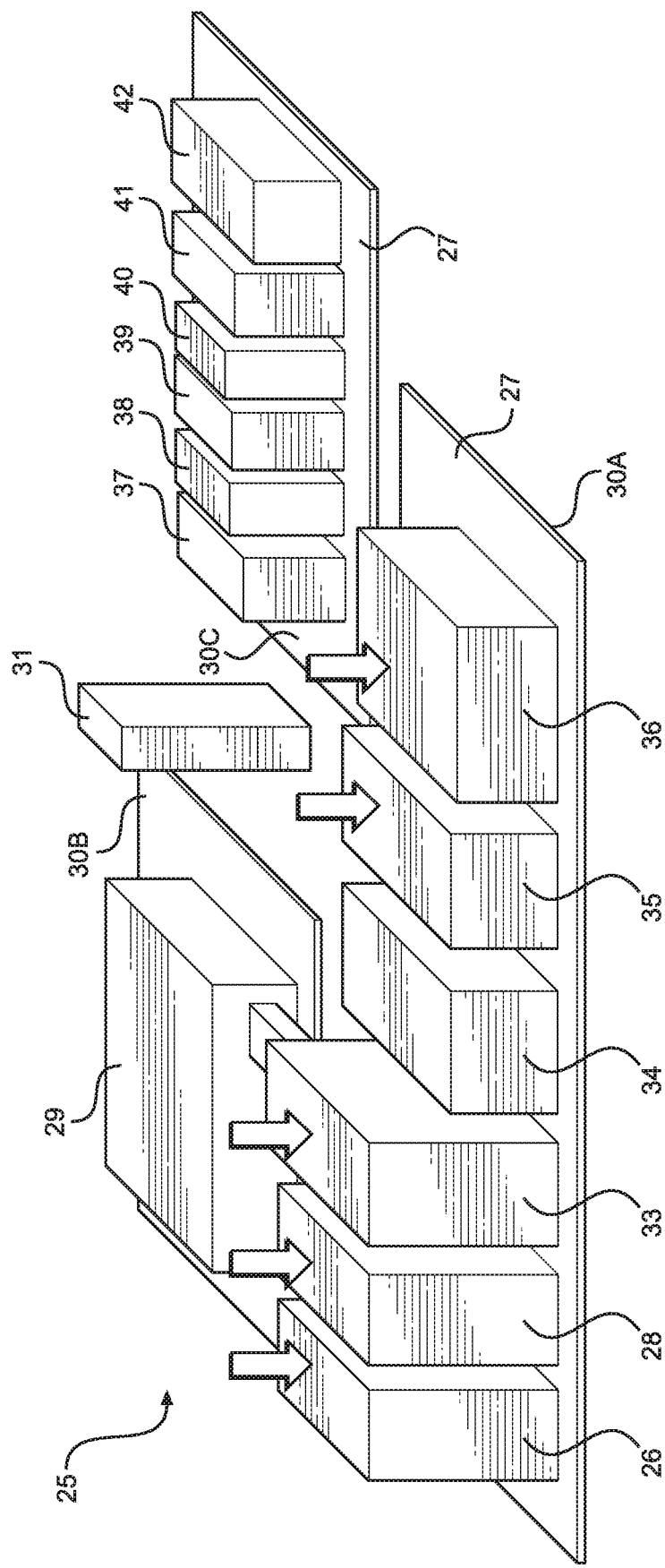
FIG. 13 is a schematic diagram of the production line supported within the solar panel construction factory system of the present invention, configured for constructing the frame-less epoxy-resin encapsulated solar panel construction of the present invention in a high-automated manner using robotic systems at many stages.

Specification of the Automated Solar Panel Construction Factory System of the Present Invention FIGS. 12 and 13 show different representations of a solar panel factory system of the present invention 25 for constructing the frame-less epoxy-resin encapsulated solar panel construction 10, 10', 10" described in FIGS. 5A through 11. As shown in FIG. 12, the factory system 25 comprises a plurality of stages, namely: an automated phenolic sheet feeding stage 26 for storing a supply of reinforced non-conductive phenolic resin sheets 15 for feeding to a conveyor transport system 27 extending through and between each stage along the primary automated production line 30A; an adhesive coating stage 28 for automatically applying a controlled coating of liquid adhesive material 16 on the top surface of each phenolic resin sheet as it is moving along the conveyor transport system 27; a solar cell array stringing and tabbing stage 29 arranged on a second production line 30B for stringing and tabbing together the solar cell modules into PV solar cell subcircuits using electrical conductors 13 that have the appearance of strings and tabs, and being brought onto the primary production line 30A by an automatic robot handling system 31 under a control and automation system 32; a solar cell array placement stage 33 for automatically picking up and placing the tabbed and stringed array of PV solar cell modules 12 upon a layer of uncured adhesive liquid 16 applied to the top surface of a phenolic resin sheet 15 during the production process: an air drying stage 34 for allowing the adhesive liquid coating to air dry before being moved to the next stage; an electrical bus attachment and soldering stage 35 for making electrical soldered connections between the strings and tabs of the electrical conductors 13 and buses 14 mounted on the phenolic sheet 15; an encapsulating epoxy-resin coating application stage 36 for automatically applying the encapsulating epoxy-resin coating 17 over the solar cell array, soldered electrical conductors and buses mounted on the phenolic sheet, to a sufficient thickness required to provide protection to the solar cell modules and electrical conductors and buses; a partial-drying and trimming stage 37 maintained off the primary production line 30A along a third production line 30C, for allowing the applied encapsulating epoxy-resin coating 17 to dry before being moved to next stage of the manufacturing and assembly process; an epoxy-resin top-protective coating application stage 38 for automatically applying the top-protective epoxy-resin liquid coating 18 over the applied and cured epoxy-resin encapsulating coating 17; a drying and trimming stage 39 for allowing the top-coated epoxy-resin coating 18 dry and trimming and finishing (e.g. polishing) the perimeter edges of the panel assembly for finishing purposes: an electrical connector (e.g. junction box) mounting stage 40 for mounting a low-profile electrical connector junction box 19 on the rear surface of each panel assembly and making electrical connections with its PV solar panel circuit schematically represented in FIG. 11 for illustrative purposes; an electrical testing stage 41 for producing a virtual source of solar radiation emulating the intensity of the Sun on particular days of the year at different locations on the Earth, and measuring and recording the V−I electrical response characteristics of each solar panel being tested and certified as to test performance, with the results being automatically logged into a product database maintained within the factory system; and a solar panel packaging stage 42 for packaging each frame-less epoxy-resin encapsulated solar panel 10 produced from the production line of the factory system.

FIG. 13 shows the solar panel construction factory system depicted in FIG. 12, but spatially arranged to show its several production lines and stages as might be more likely arranged on an actual factory floor. In particular, stage 37 requiring a several hour delay to allow for the time-lapsed curing of the 2-part epoxy-resin coating 17 will typically be realized on a separate production line or branch, to allow for solar panel assemblies to be queued up during the during and curing process, while other stages of the manufacturing process are allowed to continue without interruption. Then at a later time, after the epoxy-resin coating 17 has cured on each solar panel assembly, the assembly is moved onto the next stage along the production line, where the top protective epoxy-resin coating 18 is applied in an automated manner, and then allowed to cure, as described.

In the illustrative embodiment, conventional automated production lines and machinery for PV panels systems can be adapted and modify as necessary, in view of the present invention disclosure, to product and operate the automated production lines and factory system described herein and modeled in detail in FIGS. 12 and 13. For purposes of illustration, any one or many commercially available producers of equipment for the manufacture of solar panels, providing turnkey solar manufacturing lines, and automatic and/or semi-automatic machinery for the manufacture of photovoltaic panels (e.g. Mondragon Assembly, based in Spain, https://www.mondragon-assembly.com, can be used to supply conventional system components such as tabber stringers, interconnection modules, PV module inspection machines, cell testers, sorters and conveyors and robotic transporters. Following the principles of the present invention, these system components can be adapted and integrated together with the automated phenolic sheet feeding subsystem 26, the automated polymer adhesive coating subsystem 28, the air drying tunnel subsystem 34, the epoxy resin coating subsystem 36, and curing and trimming stage 37, and the like disclosed herein, so as to design, configure and produce the automated solar panel production systems of the present invention, as shown in FIGS. 12 and 13 using ordinary skill in the art given the benefit of the present invention disclosure.

When realizing the automated polymer adhesive coating subsystem 28, spray application technology and/or mechanical applications can be used to apply the adhesive coating to the desired thickness, at the required temperatures for the liquid adhesive being used.

When realizing the air drying tunnel subsystem 34, electric or gas driven heaters can be used to maintain the temperature in the drying tunnel to accelerate the air-drying process, involving the adhesive, as desired.

When realizing the epoxy resin coating subsystem 36, spray application technology and/or mechanical applications can be used to apply the 2-part epoxy-resin coating to the desired thickness, at the required temperatures for the liquid polymer coating being used. Providing sufficient dwell time along the production line is required to enable the polymer resin molecules to polymerize in the presence of the hardeners, and achieve the desired epoxy-resin coating for the present invention.

When realizing the curing and trimming stage 37, manual and/or automated cutting mechanisms can be employed, to trim any excess material from the panel during the manufacturing process.

Figure 14:
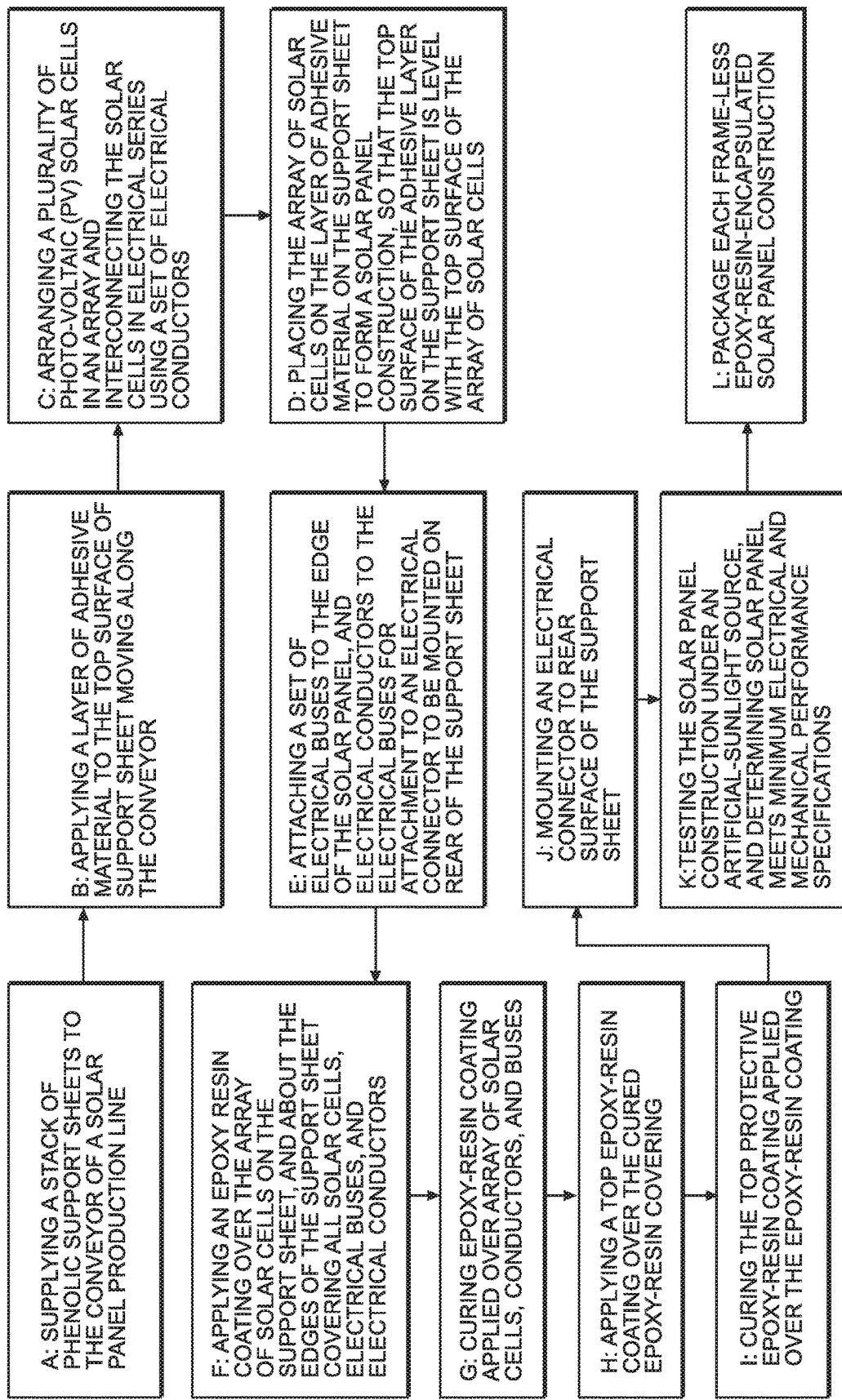
FIG. 14 is a flow chart describing the primary steps carried out during the process of manufacturing the frame-less epoxy-resin encapsulated solar panel construction of the present invention, using the production line modeled in FIGS. 12 and 13.

Specification Of The Process Of Manufacturing The Frame-Less Epoxy-Resin Encapsulated Solar Panel Construction Of The Present Invention FIG. 14 describes the primary steps carried out during the process of manufacturing the frame-less epoxy-resin encapsulated solar panel 10 of the present invention, using the production line modeled in FIGS. 12 and 13. As shown, the method comprises: (a) supplying a stack of phenolic support sheets 15 to the conveyor transport system 27 of a solar panel production line; (b) applying a layer of adhesive material to the top surface of support sheet moving along the conveyor; (c) arranging a plurality of photo-voltaic (PV) solar cell modules in an array and interconnecting the solar cell modules in electrical series using a set of electrical conductors; (d) placing the array of solar cell modules on the layer of adhesive material on the support sheet to form a solar panel construction, so that the top surface of the adhesive layer on the support sheet is level with the top surface of the array of solar cell modules; (e) attaching a set of electrical buses 14 to the edge of the solar panel, and electrical conductors 13 to the electrical buses 14 for attachment to an electrical connector in the electrical junction box 19 to be mounted on rear of the support sheet 12; (f) applying an encapsulating epoxy-resin coating 17 over the array of solar cell modules on the support sheet, and about the edges of the support sheet covering all solar cell modules 12, electrical 13 and electrical conductors 14; (g) curing the epoxy resin coating 17 applied over the array of solar cell modules 12, electrical buses 13 and electrical conductors 14; (h) applying a top-protective epoxy-resin coating 18 over the applied and cured epoxy-resin coating 17; (i) curing the top-protective epoxy-resin coating 18 applied over the epoxy-resin coating 17; (j) mounting an electrical connector junction box 19 to rear surface of the support sheet 12; (k) testing the solar panel construction under an artificial-sun light source, and determining that solar panel meets its minimum electrical and mechanical performance specifications; and (l) package each frame-less epoxy-resin encapsulated solar panel 10 produced from the production line of the automated factory system 25.

Specification Of The Frame-Less Epoxy-Resin Encapsulated Solar Panel Construction Of The Second Illustrative Embodiment of The Present Invention FIGS. 15A, 15B, 16 and 17 show the second illustrative embodiment of the frame-less epoxy-resin encapsulated solar panel construction 30 comprising: an array of photo-voltaic (PV) solar cell modules and modules 12 connected to an electrical conductors 13 and buses 14, adhesively bonded to a non-conductive reinforced sheet of phenolic resin 12, and encapsulated in a layer of adhesive material coating 16 having a thickness substantially equal to the array of solar cell modules 12. As shown, the array of photo cell modules 12, the conductors 13, the buses 14 and the adhesive layer 16 are coated with an optically transparent layer of epoxy-resin material 17 which is allowed to partially cure. Upon the partially-cured epoxy-resin coating 17, a polycarbonate sheet 23 is applied and bonded to the optically transparent layer or coating 17 on the array of photo cell modules 12 on the phenolic resin sheet 15. Finally, an optically transparent epoxy resin encapsulating coating 18 is applied over the polycarbonate sheet 23 to provide a thin clear coating that is hydro-phobic, oleo-phobic and ice-phobic to provide self-cleaning action when wet during rain showers.

Figure 19A:
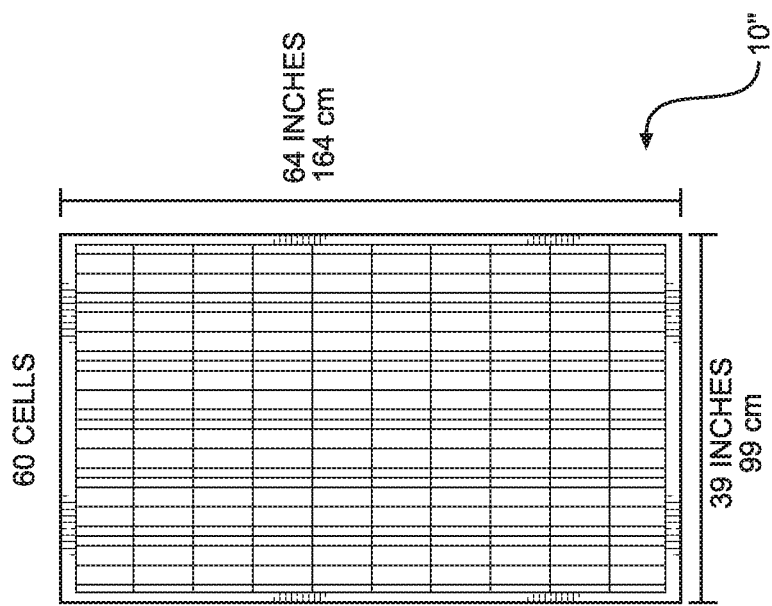
FIG. 19A is a plan view of a frameless solar panel construction of the first illustrative embodiment of the present invention, supporting 72 cell solar cell array, measuring 77 inches×39 inches (196 cm×99 cm)
Figure 19B:
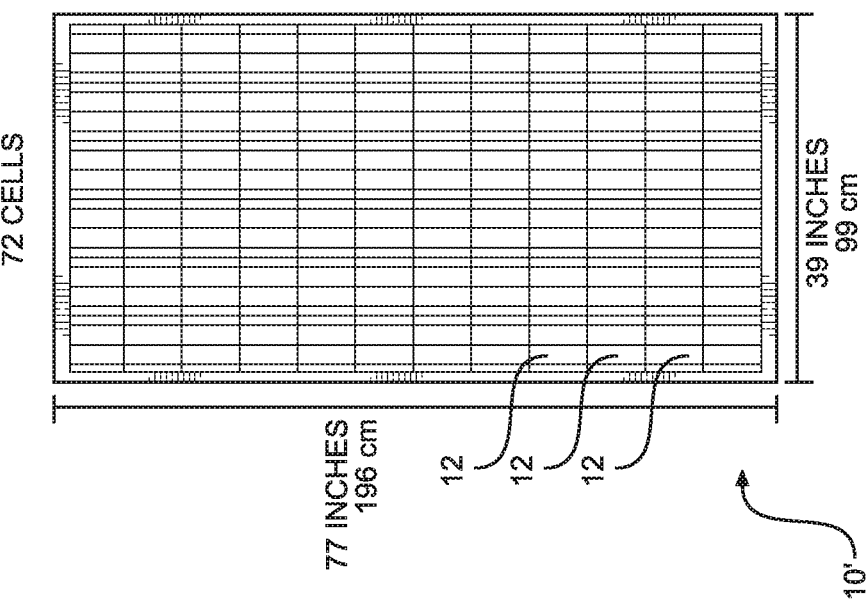
FIG. 19B is a plan view of a frameless solar panel construction of the first illustrative embodiment of the present invention, supporting 60 cell solar cell array, measuring 64.5 inches×39 inches (164 cm×99 cm)

In the illustrative embodiment, the phenolic resin sheet 23 has physical dimensions (L×W) commensurate with the size of the panel construction as shown in FIGS. 19A and 19B, and a thickness generally between ⅛ to 3/16 of an inch.

The adhesive encapsulating layer 16 deposited on the phenolic resin substrate sheet 15 can be realized using LiquiGuard® FTC-03F liquid coating, described above, applied at a dry film thickness (DFT) equal to the thickness of a photo-cells in the array 12. The adhesive coating 16 can be dried using a drying tunnel to accelerate drying time.

The array of PV photo cell modules 12 are connected together with conductive strips 13 and buses 14, known in the art, using stringing and tabbing machines. Mondragon Assembly, an internationally recognized producer of equipment for the manufacture of solar panels, makes and sells tabbing and stringer equipment, interconnection equipment, PV module testing, etc. for use in practicing the factory system of the present invention. They design and provide turnkey production lines and machinery for photovoltaic systems. https://www.mondragon-assembly.com/solar-automation-solutions/

The optically transparent epoxy resin encapsulating layer 17 is realized using two-component hybrid polysioxane clear coating (e.g. Silcote-AP from LiquiGuard Technologies) containing a 100% solids and applied to 1.0 to 1.25 mm thickness, and allowed to partially cure for approximately 1.5 hours.

The clear polycarbonate sheet has a thickness of a ⅛ to 3/16 inch applied to and upon the partially-cured Silcote-AP coating 17, so that that the polycarbonate sheet 23 will bond thereto when the epoxy-resin completely cures over the next 1.5 hours. The clear polycarbonate sheet 23 placed on top of the partially-cured Silcote-AP coating 17 permits the polycarbonate sheet 23 to bond with the Silcote-AP coating 17 and become a fully attached part of the lower assembly without the need for attachment hardware. The function of the polycarbonate sheet 23 is to provide a high impact barrier to hail and other harsh environmental elements which may come in contact with the solar panel construction.

As shown, an optically transparent epoxy-resin top-protective coating 18 is applied over the polycarbonate sheet 23, and can be realized using LiquiGuard® EFS-100 2-component epoxy-resin coating 18, described above, applied at a thickness of about 0.1 mm, dry film thickness (DFT). This clear epoxy-resin top-protective coating 18 is extremely hydro-phobic, oleo-phobic and ice-phobic, preventing dirt and other contaminants from bonding to the surface, and enable easy cleaning and self-cleaning during rain showers.

The resulting PV solar panel assembly construction 10''' is frameless, and has high-strength edges that can be drilled, on job sites, with holes for edge mounting in diverse environments including, for example, horizontal and inclined rooftops, as well as vertical wall mounting applications.

In the preferred embodiment, the photo-voltaic solar cell modules 12 are commercially available from various manufacturers and suppliers, and may be made from various photo-voltaic technologies including, for example: (i) mono-crystalline or multi-crystalline silicon photo-voltaic solar cell modules; (ii) copper indium gallium selenide (CIGS) photo-voltaic solar cell modules; (iii) cadmium telluride (CdTe) photo-voltaic solar cell modules; (iv) peroskite photo-voltaic solar cell modules; and (v) organic photo-voltaic solar cell modules, or plastic photo-voltaic solar cell modules.

Preferably, the non-conductive reinforced phenolic resin sheet 15 will have a thickness between ⅛ to 3/16 inches, and provide a support substrate for the solar cell assembly. The reinforced phenolic resin sheet can be made to be clear (i.e. light transparent) or colored with the addition of dye pigment during the manufacturing process. Such reinforced phenolic resin sheets 15 are commercially available from numerous vendors.

Preferably, the adhesive encapsulating layer 16 can be realized using LiquiGuard® FTC-03F water-based air-dried polymer adhesive coating consisting of a one part system that does not polymerize to achieve adhesive bonding. In this case, the adhesion occurs because of the high tack and phenolic content of the polymer, and the bond is developed through the process of the water content evaporating from the fluid material. In the illustrative embodiment, the LiquiGuard® FTC-03F adhesive has a viscosity of 3000 cps, with 35% solids, when being applied with a dried film thickness (DFT) substantially equal to that of a photo-cell (e.g. 150-325 microns) so that the top surfaces of the photo cell modules and surrounding adhesive coating reside substantially in the same plane, to provide relatively smooth and planar surface characteristics. This liquid adhesive coating can be evaporatively-dried without cross-linking using a drying tunnel on the production line to accelerate drying time, as will be discussed in greater detail hereinafter.

The optically transparent or clear epoxy-resin encapsulating coating 17 applied over the adhesive encapsulating coating 16 can be realized using LiquiGuard® Silcote-AP, from LiquiGuard Technologies, Inc., described above, in the same mixing ratio. The optically transparent or clear epoxy-resin top-protective coating 18 can be realized using the LiquiGuard® EFS-100 two-component formulation, described above, in the same mixing ratio.

Figure 15A:
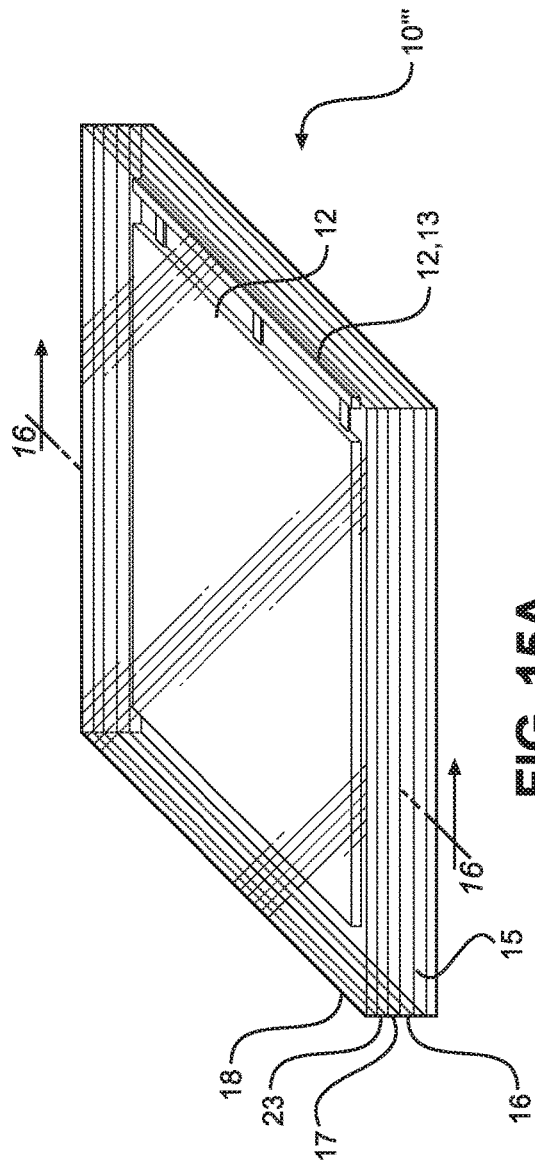
FIG. 15A is a upper perspective view of the second illustrative embodiment of the frame-less epoxy-resin encapsulated solar panel construction of present invention, showing its array of photo-voltaic (PV) solar cell modules connected to an electrically-conductive bus bar assembly, adhesively bonded to a sheet of phenolic resin, and encapsulated in a layer of adhesive material having a thickness substantially equal to the array of solar cell modules, and wherein the array of photo cell modules, conductors and buses and adhesive layer are coated with an optically transparent layer of epoxy-resin material which is allowed to partially cure, whereupon a polycarbonate sheet is applied and bonded to the optically transparent layer encapsulating the array of photo cell modules on the phenolic resin sheet, and finally an optically transparent epoxy resin coating is applied over the polycarbonate sheet to provide a think clear coating that is hydro-phobic and oleo-phobic to provide self-cleaning action when wet during rain showers.
Figure 16:
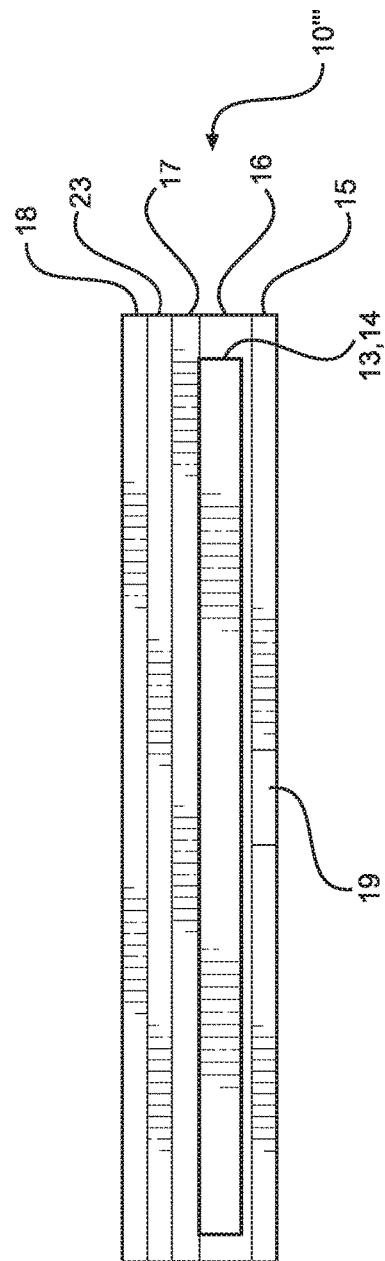
FIG. 16 is a cross-sectional view of the frame-less epoxy-resin encapsulated solar panel construction of present invention, taken along line 16-16 in FIG. 15A.
Figure 15B:
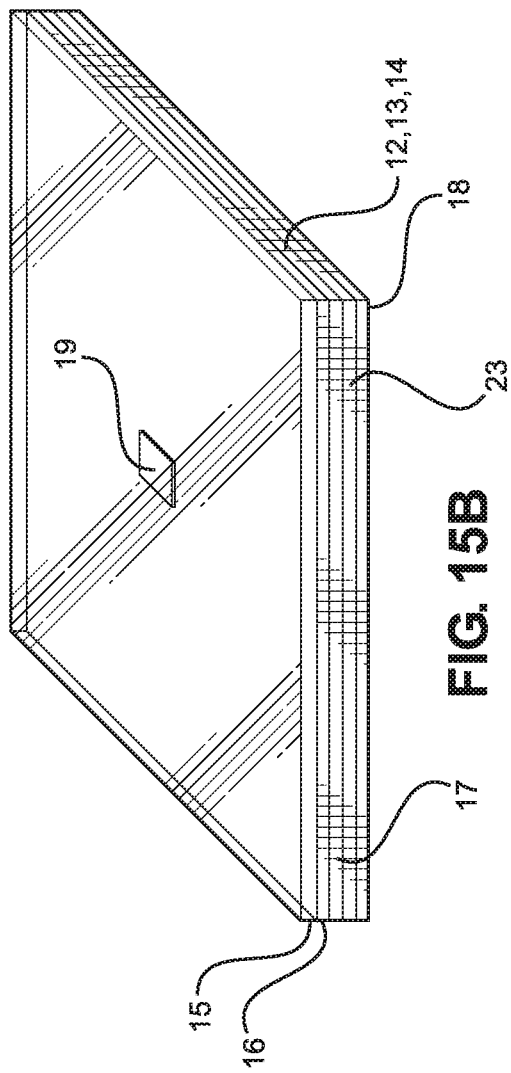
FIG. 15B is a lower perspective view of the illustrative embodiment of the frame-less epoxy-resin encapsulated solar panel construction of FIG. 5A, showing its rear mounted electrical connector junction box, mounted to the rear of the sheet of phenolic resin.
Figure 17:
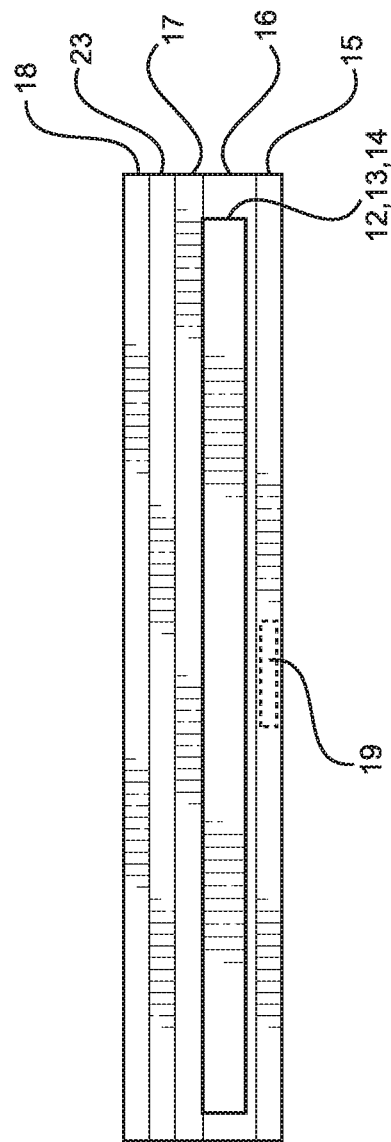
FIG. 17 is an elevated side view of the frame-less epoxy-resin encapsulated solar panel construction shown in FIGS. 15A, 15B and 16.
Figure 18:
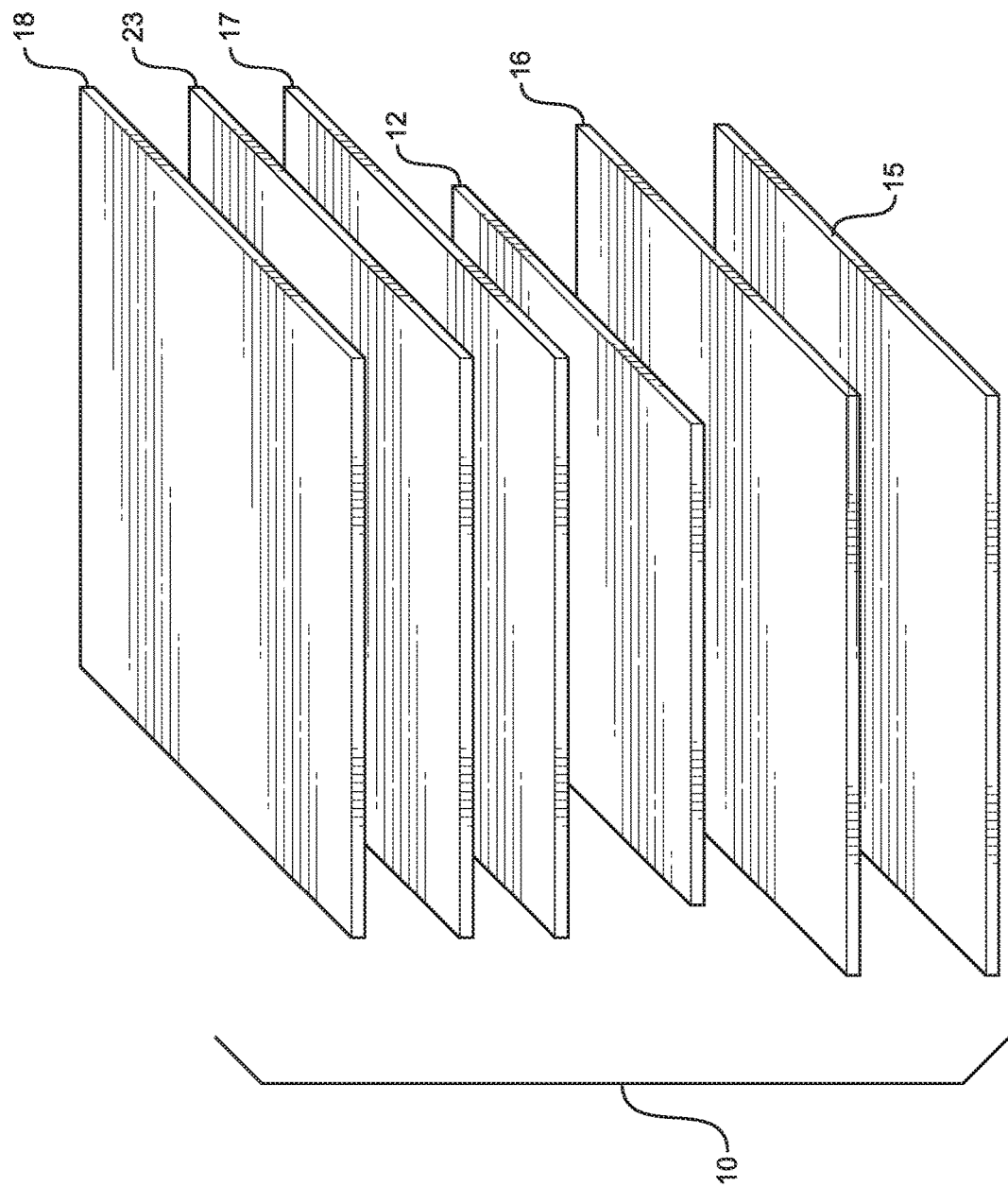
FIG. 18 is an exploded diagram of the frame-less epoxy-resin encapsulated solar panel construction shown in FIGS. 15A and 15B.

FIG. 18 shows the frame-less epoxy-resin encapsulated solar panel construction of FIGS. 15A and 15B in exploded form, comprising: the non-conductive reinforced phenolic resin sheet 15 with thickness generally between ⅛ to 3/16 of an inch; the adhesive encapsulating layer 16 deposited on the substrate sheet 15; the array of PV photo cell modules 12, connected together with conductive strips 13 and buses 14, known in the art, and adhered to the phenolic resin sheet; the clear epoxy-resin coating layer 17 applied to 1.0 to 1.25 mm thickness; the polycarbonate sheet 23 of ⅛ to about ⅜ thickness; and the clear epoxy-resin top protective coating 18, applied at a thickness of about 0.1 mm, dry film thickens (DFT).

When using the LiquiGuard® system of adhesive and epoxy-resin products described above (i.e. LiquiGuard® FTC-03F adhesive liquid, LiquiGuard® Silcote-AP epoxy-resin formulation, and LiquiGuard® EFS-100 epoxy-resin formulation), it is also expected that none of these components of the frameless encapsulated epoxy-resin PV solar panel construction 10''' of the second illustrative embodiment will discolor or yellow during the lifetime of the frameless solar panel construction, and otherwise remain optically transparent and crystal clear, unlike conventional epoxy-resin based systems known in the art. The advantage of this system will be a more attractive looking product with great aesthetic value to the consumer, and less filtering of solar radiation energy from the Sun, and therefore improving the energy conversion efficiency of the PV solar cell arrays encapsulated in the solar panel construction 10'''.

Figure 21:
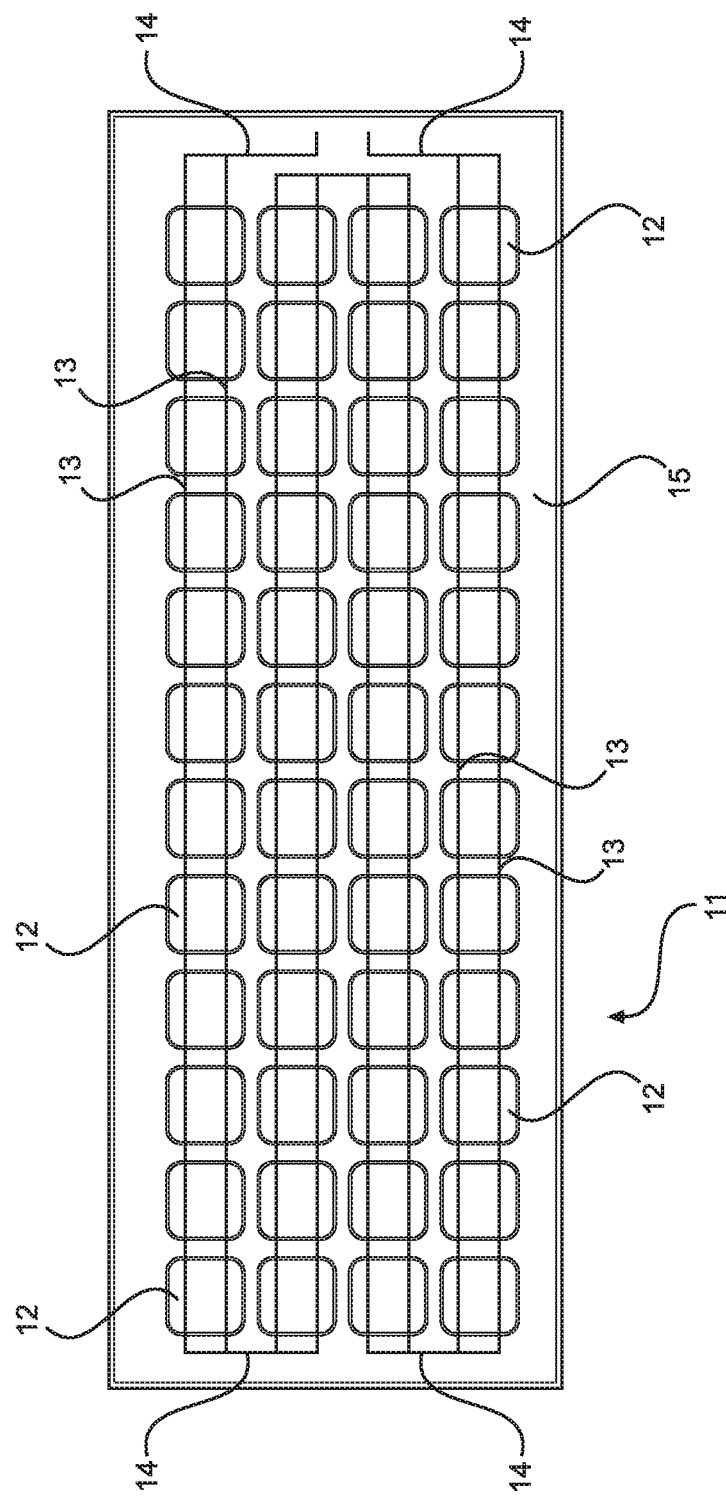
FIG. 21 is a schematic representation of an exemplary solar cell array circuit implemented on a frameless solar panel construction according to the present invention, wherein four electrical circuits connected in electrical series are each formed by connecting 12 PV solar cell modules in electrical parallel configuration.

FIG. 19A shows a frameless solar panel construction of the first illustrative embodiment of the present invention, supporting 72 cell solar cell array, measuring 77 inches×39 inches (196 cm×99 cm). FIG. 19B shows a frameless solar panel construction of the first illustrative embodiment of the present invention, supporting 60 cell solar cell array, measuring 64.5 inches×39 inches (164 cm×99 cm). FIG. 21 shows how the solar cell modules may be electrically connected to construct a solar power generating circuit with the desired voltage and current characteristics required by the application at hand. Clearly, the frameless solar panel construction of the present invention can be made to any size for virtually any application requiring photo-voltaically generated electrical power. Typically, the PV panel constructions of the present invention generate DC electrical power. However, it is understood that electrical DC-AC power conversion circuits can be integrated with the panel construction, and even mounted on the rear surface of the phenolic resin board, so as to provide solar panels capable of generating and supplying AC electrical power to electrical loads, in applications requiring the same.

FIG. 20 shows the rear view of the frame-less epoxy-resin encapsulated solar panel construction shown in FIGS. 15A, 15B, 16, 17 and 18, and more particularly the electrical junction box 19 that is mounted to rear surface thereof using conventional mounting methods. The function of the junction box 19 is to support electrical power jacks 20A and 20B for connection of electrical power cables 21A, 21B that connect each solar panel device to an electrical power system supported within the building, house or other environment in which the solar panel device may be installed.

Figure 22:
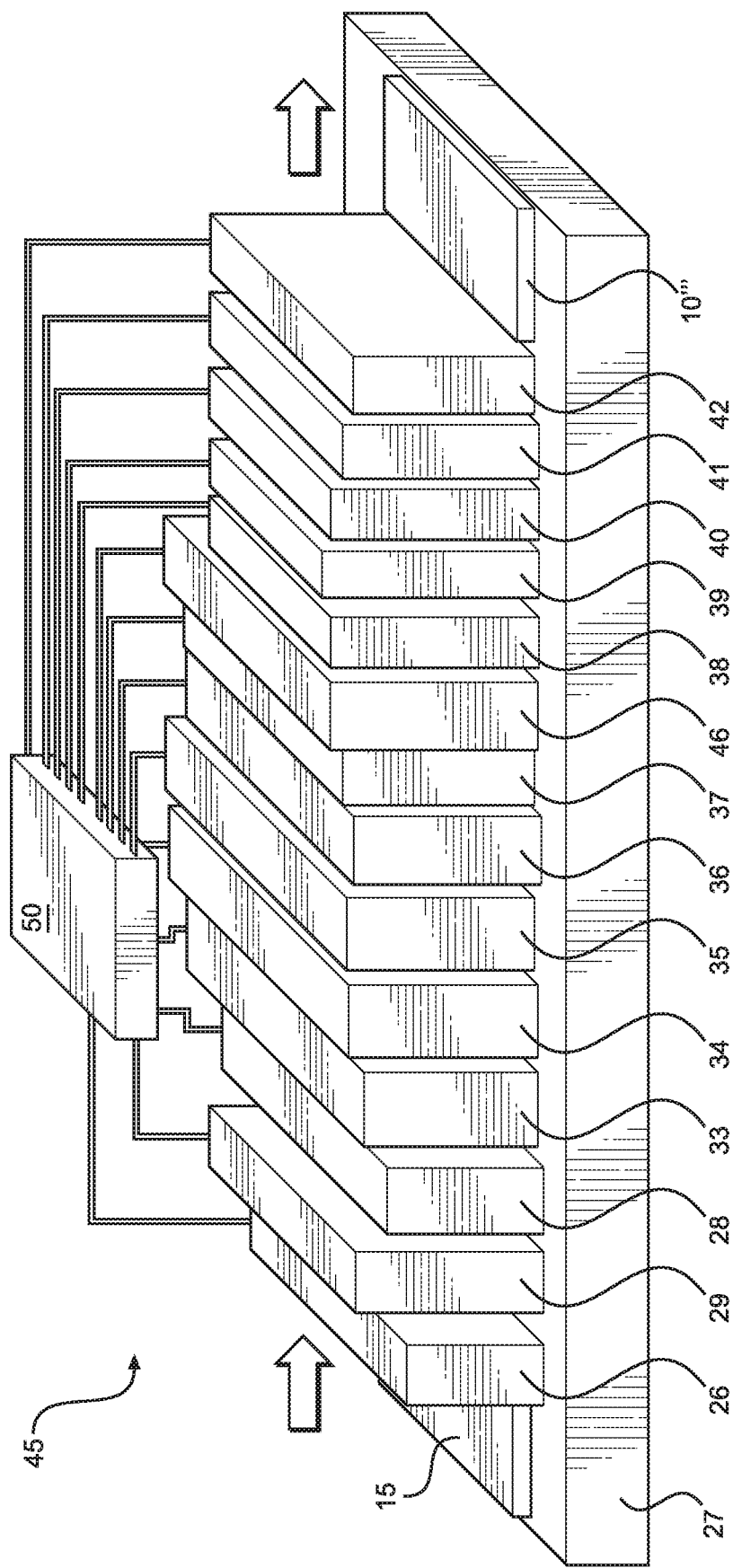
FIG. 22 is a schematic diagram of the solar panel factory system of the present invention for constructing the frame-less epoxy-resin encapsulated solar panel construction of the present invention.
Figure 23:
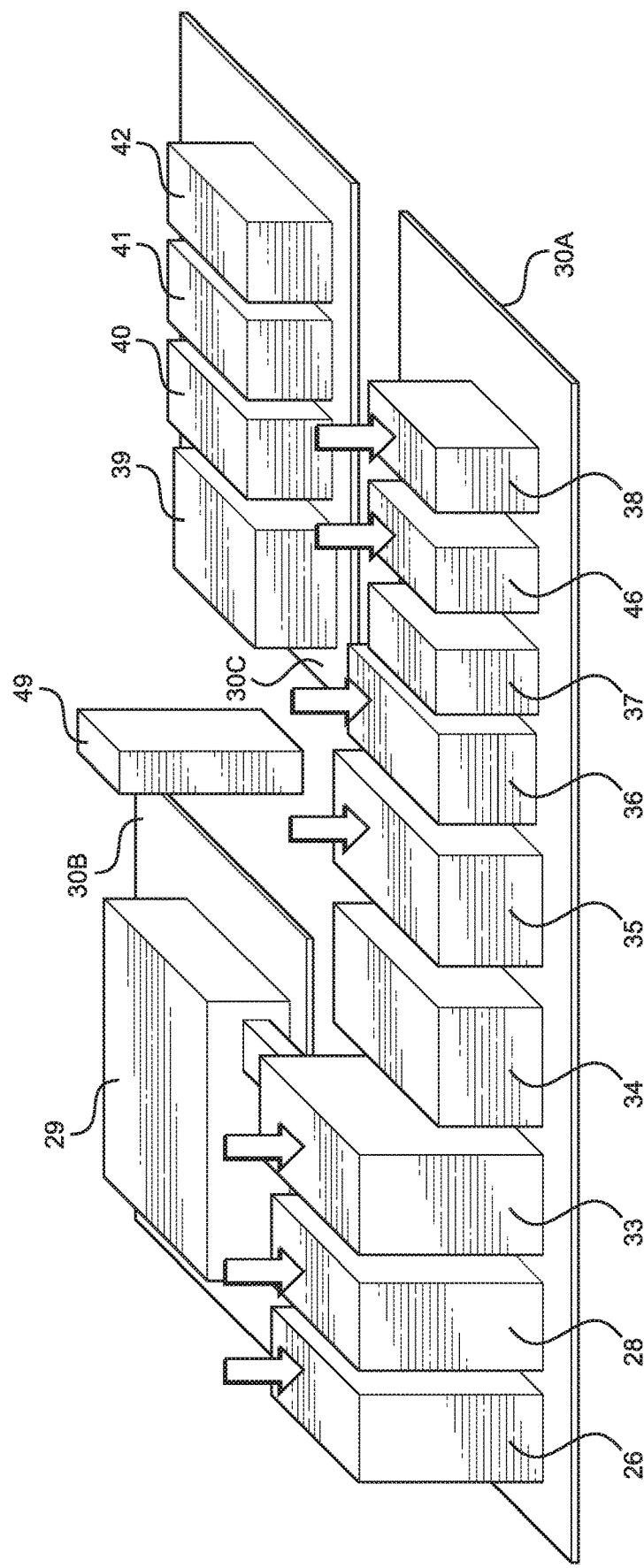
FIG. 23 is a schematic diagram of the production line supported within the solar panel construction factory system of the present invention, configured for constructing the frame-less epoxy-resin encapsulated solar panel construction of the present invention in a high-automated manner using robotic systems at many stages.

Specification Of The Automated Solar Panel Construction Factory System Of The Present Invention FIGS. 22 and 23 show different representations of a solar panel factory system of the present invention 10''' for constructing the frame-less epoxy-resin encapsulated solar panel construction of the present invention described in FIGS. 15A through 21. As shown, the factory system 45 comprises a plurality of stages, namely: an automated phenolic sheet feeding stage 26 for storing a supply of reinforced phenolic sheets 15 for feeding to an extended conveyor transport system 27 extending through and between each stage along the primary automated production line 30A; an adhesive coating stage 28 for automatically applying a controlled coating of liquid adhesive material 16 on the top surface of each phenolic sheet as it is moving along the conveyor transport system 27; a solar cell array stringing and tabbing stage 29 arranged on a second production line 30B for stringing and tabbing together the solar cell modules into modules (i.e. PV solar cell subcircuits) using electrical conductors that have the appearance of strings and tabs, and being brought onto the primary production line 30A by an automatic robot handling system 49 under automated system controller 50; a solar cell array placement stage 33 for picking up a tabbed and stringed array of solar cell modules 12 and placing them on a layer of adhesive 16 applied to the top surface of a phenolic resin sheet 15 upon which the sheet a PV solar panel will be assembled: an air drying stage 34 for allowing the adhesive liquid coating 16 to air dry before being moved to the next stage; an electrical bus attachment and soldering stage 35 for making electrical soldered connections between the strings and tabs of the electrical conductors 13 and buses 14 mounted on the phenolic sheet 15; an encapsulating epoxy-resin coating application stage 36 for automatically applying the encapsulating epoxy-resin coating 17 over the solar cell array 12, soldered electrical conductors 13 and buses 14 mounted on the phenolic sheet 15, to a sufficient thickness required to provide protection to the solar cell modules and electrical conductors and buses; a partial-drying stage 37, maintained off the primary production line 30A along a third production line 30C, for allowing the applied encapsulating epoxy-resin coating 17 to dry before being moved to next stage of the manufacturing and assembly process; a polycarbonate panel placement stage 46 for applying a polycarbonate sheet 23 on the partially-cured optically transparent resin coating 17; an epoxy-resin top-protective coating stage 38 for applying an epoxy resin top protective coating 18 to the bonded sheet of polycarbonate 23; a top protective epoxy-resin coating application stage 38 for automatically applying the top protective epoxy-resin liquid coating 18 over the applied polycarbonate panel 23; a curing and trimming stage 39 for allowing the top-coated epoxy-resin coating 18 dry and trimming and finishing (e.g. polishing) the perimeter edges of the panel assembly for finishing purposes: an electrical connector (e.g. junction box) mounting stage 40 for mounting a low-profile electrical connector junction box 19 on the rear surface of each panel assembly and making electrical connections with its PV solar panel circuit schematically represented in FIG. 11 for illustrative purposes; an electrical testing stage 41 for producing a virtual source of solar radiation mimicking the intensity of the Sun on particular days of the year at different locations on the Earth, and measuring and recording the V–I electrical response characteristics of each solar panel being tested and certified as to test performance, with the results being logged into a product database; and a solar panel packaging stage 42 for packaging each frame-less epoxy-resin encapsulated solar panel 10''' produced from the production line of the factory system.

FIG. 23 shows the solar panel construction factory system depicted in FIG. 22, but spatially arranged to show its several production lines and stages as might be more likely arranged on an actual factory floor. In particular, stage 39 requiring a several hour delay to allow for the time-lapsed curing of the 2-part epoxy-resin coating 17 will typically be realized on a separate production line or branch, to allow for solar panel assemblies to be queued up during the during and curing process, while other stages of the manufacturing process are allowed to continue without interruption. Then at a later time, after the epoxy-resin coating 17 has cured on each solar panel assembly, the assembly is moved onto the next stage along the production line, where the polycarbonate sheet 23 and thereafter top protective epoxy-resin coating 18 are applied in an automated manner, and then allowed to cure, as described.

In the illustrative embodiment, conventional automated production lines and machinery for PV panels systems can be adapted and modify as necessary, in view of the present invention disclosure, to product and operate the automated production lines and factory system described herein and modeled in detail in FIGS. 22 and 23. For purposes of illustration, any one or many commercially available producers of equipment for the manufacture of solar panels, providing turnkey solar manufacturing lines, and automatic and/or semi-automatic machinery for the manufacture of photovoltaic panels (e.g. Mondragon Assembly, based in Spain, https://www.mondragon-assembly.com, can be used to supply conventional system components such as tabber stringers, interconnection modules, PV module inspection machines, cell testers, sorters and conveyors and robotic transporters. Following the principles of the present invention, these system components can be adapted and integrated together with the automated phenolic sheet feeding subsystem 26, the automated polymer adhesive coating subsystem 28, the air drying tunnel subsystem 34, the epoxy resin coating subsystem 36, curing and trimming stage 37, the polycarbonate panel installation subsystem 46, the top epoxy-resin coating subsystem 38, and the like disclosed herein, so as to design, configure and produce the automated solar panel production systems of the present invention, as shown in FIGS. 22 and 23, using ordinary skill in the art given the benefit of the present invention disclosure.

When realizing the automated polymer adhesive coating subsystem 28, spray application technology and/or mechanical applications can be used to apply the adhesive coating to the desired thickness, at the required temperatures for the liquid adhesive being used.

When realizing the air drying tunnel subsystem 34, electric or gas driven heaters can be used to maintain the temperature in the drying tunnel to accelerate the air-drying process, involving the adhesive, as desired.

When realizing the epoxy resin coating subsystem 36, spray application technology and/or mechanical applications can be used to apply the 2-part epoxy-resin coating to the desired thickness, at the required temperatures for the liquid polymer coating being used. Providing sufficient dwell time along the production line is required to enable the polymer resin molecules to polymerize in the presence of the hardeners, and achieve the desired epoxy-resin coating for the present invention.

When realizing the curing and trimming stage 37, manual and/or automated cutting mechanisms can be employed, to trim any excess material from the panel during the manufacturing process.

When realizing the polycarbonate panel installation subsystem 46, an automated robot with appropriate sensors and feedback will be used to install the polycarbonate panel with precision on the partially-cured epoxy-resin coating, as described in detail herein.

When realizing the top epoxy-resin coating subsystem 38, spray application technology and/or mechanical applications can be used to apply the epoxy-resin top-coating to the desired thickness, at the required temperatures for the liquid polymer coating being used. Providing sufficient dwell time along the production line is required to enable the polymer resin molecules to polymerize in the presence of the hardeners, and achieve the desired top epoxy-resin top-coating for the present invention.

Figure 24:
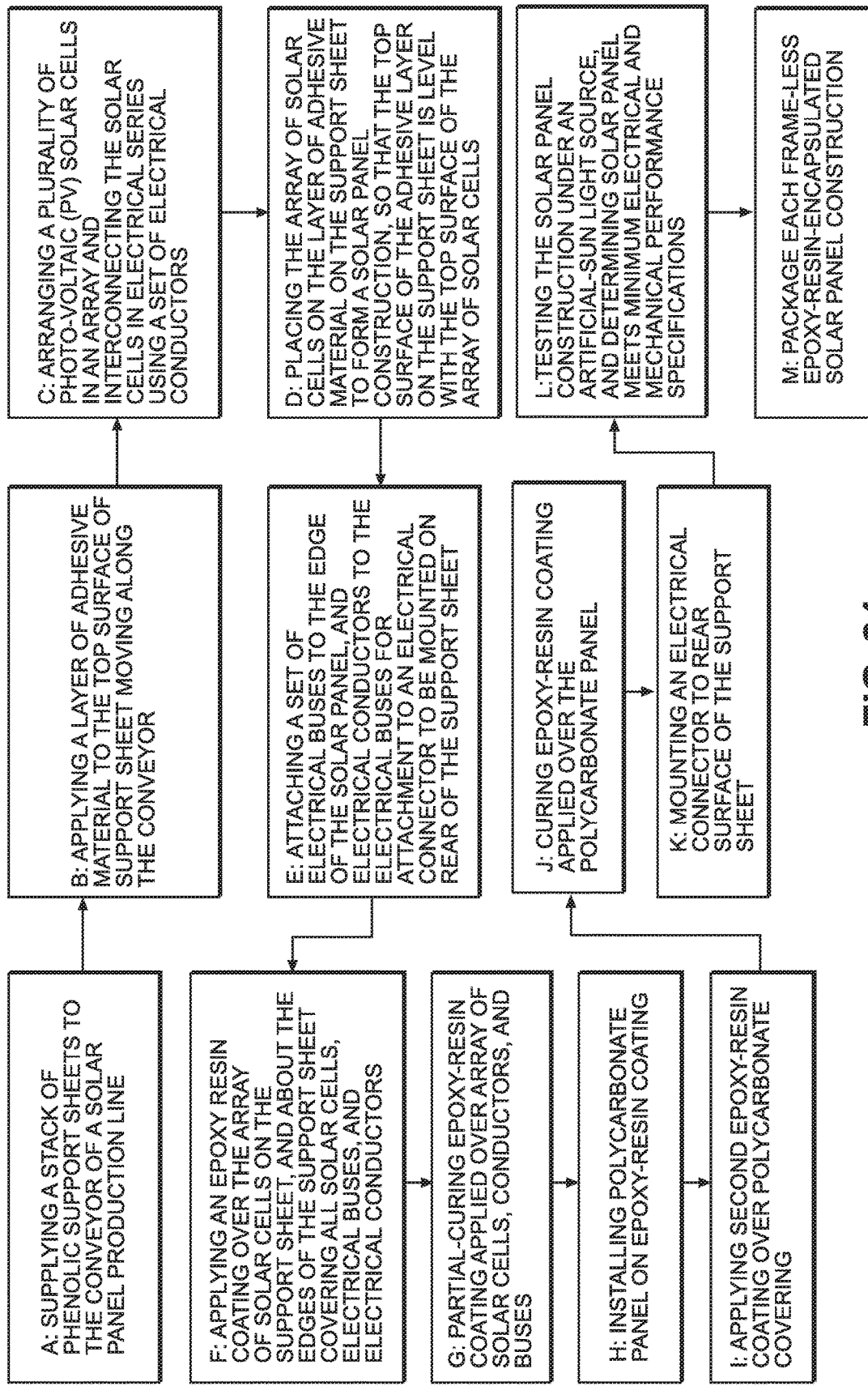
FIG. 24 is a flow chart describing the primary steps carried out during the process of manufacturing the frame-less epoxy-resin encapsulated solar panel construction of the present invention, using the factory production line modeled in FIGS. 22 and 23.

Specification Of The Process Of Manufacturing The Frame-Less Epoxy-Resin Encapsulated Solar Panel Construction Of The Present Invention FIG. 24 describes the primary steps carried out during the process of manufacturing the frame-less epoxy-resin encapsulated solar panel 10''' of the present invention, using the production line modeled in FIGS. 22 and 23. As shown, the method comprises: (a) supplying a stack of phenolic support sheets 15 to the conveyor transport system 27 of a solar panel production line; (b) applying a layer of adhesive material to the top surface of support sheet moving along the conveyor; (c) arranging a plurality of photo-voltaic (PV) solar cell modules in an array and interconnecting the solar cell modules in electrical series using a set of electrical conductors; (d) placing the array of solar cell modules on the layer of adhesive material on the support sheet to form a solar panel construction, so that the top surface of the adhesive layer on the support sheet is level with the top surface of the array of solar cell modules; (e) attaching a set of electrical buses 12 to the edge of the solar panel, and electrical conductors 13 to the electrical buses 13 for attachment to an electrical connector in the electrical junction box 19 to be mounted on rear of the support sheet 15; (f) applying an encapsulating epoxy-resin coating 17 over the array of solar cell modules on the support sheet 15, and about the edges of the support sheet covering all solar cell modules 12, electrical buses 13 and electrical conductors 14; (g) partially curing the epoxy resin coating 17 applied over the array of solar cell modules 12, electrical buses 13, and electrical conductors 14; (h) installing a polycarbonate panel on the partially-cured epoxy-resin coating 17 and allowing the partially-cured epoxy-resin coating 17 to fully cure; (i) applying a top-protective epoxy-resin coating 18 over the polycarbonate sheet 23; (j) curing the top-protective epoxy-resin coating 18 applied over the polycarbonate sheet 23; (k) mounting an electrical connector to rear surface of the support sheet 15; (l) testing the solar panel construction 10''' under an artificial-sun light source, and determining that solar panel 10''' meets its minimum electrical and mechanical performance specifications; and (m) package each frame-less epoxy-resin encapsulated solar panel 10''' produced from the production line of the automated factory system 45.

Modifications to the Present Invention which Readily Come to Mind

The illustrative embodiments disclose novel methods and apparatus for producing lightweight yet strong frame-less photo-voltaic solar panels using a combination of phenolic resin sheets and epoxy-resin coatings, without the use of glass sheets. However, it is understood that such frame-less solar panel constructions may be provided with frame structures for cosmetic and/or mounting purposes, as the application may require, without departing from the principles of the present invention. In general, however, the PV solar cell panel constructions of the present invention do not require frame structures for strength and integrity due to the novel nature of their construction and assembly.

These and other variations and modifications will come to mind in view of the present invention disclosure. While several modifications to the illustrative embodiments have been described above, it is understood that various other modifications to the illustrative embodiment of the present invention will readily occur to persons with ordinary skill in the art. All such modifications and variations are deemed to be within the scope and spirit of the present invention as defined by the accompanying Claims to Invention.

What is claimed is:

1. A frame-less epoxy-resin encapsulated solar panel construction comprising:
    a phenolic resin support sheet made of non-conductive and reinforced phenolic resin material;
    an array of photo-voltaic (PV) solar cell modules connected to an electrically-conductive bus bar assembly and having top surfaces, and being adhesively bonded to said phenolic resin support sheet and encapsulated in an optically transparent layer of adhesive coating material;
    wherein said optically transparent layer of adhesive coating material has a thickness equal to said array of PV solar cell modules so that the top surfaces of said PV photo cell modules and surrounding adhesive coating material reside in the same plane so as to form a planar surface;
    an optically transparent epoxy-resin encapsulating layer applied over said planar surface formed by said array of (PV) solar cell modules, said electrically-conductive bus bar assembly and said optically transparent layer of adhesive coating material; and
    an optically transparent epoxy-resin top coating applied over said optically transparent epoxy-resin encapsulating layer, for providing self-cleaning action when wet during rain showers;
    wherein a high-strength edge portion is formed all around the perimeter of said frame-less epoxy-resin encapsulated solar panel construction, between said optically transparent epoxy-resin top coating and said phenolic resin support sheet; and
    wherein said high-strength edge portion of said frame-less epoxy-resin encapsulated solar panel construction is free of said array of PV solar cell modules and said electrically-conductive bus bar assembly so that mounting holes can be drilled through said high-strength edge portion without the risk of damaging said array of PV solar cell modules and said electrically-conductive bus bar assembly, and without the risk of compromising the strength and integrity of said frameless epoxy-resin encapsulated solar panel construction.

2. The frame-less epoxy-resin encapsulated solar panel construction of claim 1, wherein said optically transparent epoxy-resin top coating is applied over said optically transparent epoxy-resin encapsulating layer at a dry film thickness (DFT) of at least 0.1 mm.

3. The frame-less epoxy-resin encapsulated solar panel construction of claim 1, wherein said mounting holes drilled through said high-strength edge portion of said frame-less epoxy-resin encapsulated solar panel construction allow for the mounting of said frame-less epoxy-resin encapsulated solar panel construction in diverse environments including, horizontal and inclined rooftops, and vertical wall mounting applications.

4. The frame-less epoxy-resin encapsulated solar panel construction of claim 1, wherein said photo-voltaic (PV) solar cell modules are made from various photo-voltaic technologies selected from the group consisting of (i) mono-crystalline or multi-crystalline silicon photo-voltaic solar cell modules, (ii) copper indium gallium selenide (CIGS) photo-voltaic solar cell modules, (iii) cadmium telluride (CdTe) photo-voltaic solar cell modules, (iv) peroskite photo-voltaic solar cell modules, and (v) organic photo-voltaic solar cell modules, and plastic photo-voltaic solar cell modules.

5. The frame-less epoxy-resin encapsulated solar panel construction of claim 1, wherein said phenolic resin support sheet has a thickness between ⅛ to 3/16 inches.

6. The frame-less epoxy-resin encapsulated solar panel construction of claim 1, which further comprises an electrical connector junction box mounted to the rear of said phenolic resin support sheet to provide support for electrical power jacks for connection of electrical power cables that connect said frame-less epoxy-resin encapsulated solar panel construction to an electrical power system supported within a building, house or other environment in which said frame-less epoxy-resin encapsulated solar panel construction is installed.

* * * * *